(12) United States Patent
Chen et al.

(10) Patent No.: US 10,483,356 B2
(45) Date of Patent: Nov. 19, 2019

(54) POWER SEMICONDUCTOR DEVICE WITH OPTIMIZED FIELD-PLATE DESIGN

(71) Applicant: SILICONIX INCORPORATED, Santa Clara, CA (US)

(72) Inventors: Max Shih-kuan Chen, New Taipei (TW); Hao-Che Chien, Taipei (TW); Loizos Efthymiou, Cambridge (GB); Florin Udrea, Cambridge (GB); Giorgia Longobardi, Cambridge (GB); Gianluca Camuso, Villach (AT)

(73) Assignee: SILICONIX INCORPORATED, San Jose, CA (US)

( * ) Notice: Subject to any disclaimer, the term of this patent is extended or adjusted under 35 U.S.C. 154(b) by 0 days.

(21) Appl. No.: 15/906,698

(22) Filed: Feb. 27, 2018

(65) Prior Publication Data

US 2019/0267456 A1    Aug. 29, 2019

(51) Int. Cl.
*H01L 29/40* (2006.01)
*H01L 23/528* (2006.01)
(Continued)

(52) U.S. Cl.
CPC .......... *H01L 29/404* (2013.01); *H01L 23/528* (2013.01); *H01L 24/03* (2013.01); *H01L 24/05* (2013.01); *H01L 29/0634* (2013.01); *H01L 29/2003* (2013.01); *H01L 29/205* (2013.01); *H01L 29/402* (2013.01); *H01L 29/405* (2013.01); *H01L 29/66462* (2013.01); *H01L 29/7787* (2013.01); *H01L 23/5226* (2013.01); *H01L 29/41758* (2013.01); *H01L 2224/05073* (2013.01); *H01L 2224/05082* (2013.01); *H01L 2224/05124* (2013.01);
(Continued)

(58) Field of Classification Search
CPC . H01L 29/402; H01L 29/0634; H01L 29/404; H01L 29/405
See application file for complete search history.

(56) References Cited

U.S. PATENT DOCUMENTS 9,722,063 B1 * 8/2017 Kudymov ........... H01L 29/7787
2001/0028083 A1   10/2001 Onishi et al.
(Continued)

FOREIGN PATENT DOCUMENTS

KR    20170048126 A    5/2017

OTHER PUBLICATIONS

McPherson JW et al., "Complementary model for intrinsic time-dependent dielectric breakdown in SiO2 dielectrics," Journal of Applied Physics, vol. 88, No. 9, pp. 5351-5359 (2000); <https://doi.org/10.1063/1.1318369>.
(Continued)

*Primary Examiner* — Ngan V Ngo
(74) *Attorney, Agent, or Firm* — Volpe and Koenig, P.C.

(57) ABSTRACT

A power semiconductor device and method for making same are disclosed. The device includes a source bonding pad and a drain bonding pad, a drain metallization structure including a drain field plate connected to the drain bonding pad, and a source metallization structure comprising a source field plate connected to the source bonding pad. At least a portion of at least one of the bonding pads is situated directly over an active area. A dimension of at least one of the field plates varies depending upon the structure adjacent to the field plate.

10 Claims, 23 Drawing Sheets

(51) Int. Cl.
*H01L 29/20* (2006.01)
*H01L 29/205* (2006.01)
*H01L 29/778* (2006.01)
*H01L 29/66* (2006.01)
*H01L 23/00* (2006.01)
*H01L 29/06* (2006.01)
*H01L 23/522* (2006.01)
*H01L 29/417* (2006.01)

(52) U.S. Cl.
CPC ............ *H01L 2224/05166* (2013.01); *H01L 2224/05573* (2013.01); *H01L 2224/05666* (2013.01); *H01L 2924/04941* (2013.01)

(56) References Cited

U.S. PATENT DOCUMENTS

| | | | |
|---|---|---|---|
| 2010/0230717 A1* | 9/2010 | Saito | H01L 29/0692 257/140 |
| 2012/0280280 A1 | 11/2012 | Zhang | |
| 2013/0075925 A1 | 3/2013 | Iwabuchi et al. | |
| 2014/0264431 A1* | 9/2014 | Lal | H01L 27/0883 257/121 |
| 2014/0312362 A1 | 10/2014 | Makiyama | |
| 2016/0149007 A1* | 5/2016 | Chou | H01L 29/402 257/339 |
| 2016/0005811 A1 | 7/2016 | Weber et al. | |
| 2016/0315188 A1* | 10/2016 | Disney | H01L 29/7816 |
| 2017/0077282 A1* | 3/2017 | Lee | H01L 29/66462 |
| 2017/0170284 A1* | 6/2017 | Li | H01L 29/401 |
| 2017/0330940 A1 | 11/2017 | Lee | |
| 2018/0026105 A1* | 1/2018 | Zhang | H01L 29/402 257/367 |
| 2018/0076310 A1* | 3/2018 | Sheridan | H01L 29/2003 |
| 2018/0158909 A1* | 6/2018 | Mishra | H01L 29/408 |
| 2019/0028065 A1* | 1/2019 | Mahon | H03F 1/301 |

OTHER PUBLICATIONS

Osburn, C.M., et al., "Dielectric Breakdown in Silicon Dioxide Films on Silicon," Journal of the Electrochemical Society, Solid-State Science and Technology, vol. 119, No. 5, pp. 591-597, May 1972.

Osburn, C.M., et al. "Electrical Conduction and Dielectric Breakdown in Silicon Dioxide Films on Silicon," Journal of the Electrochemical Society, Solid-State Science and Technology, vol. 119, No. 5, pp. 603-609, May 1972.

Mishra, U.K., et al., "GaN-Based RF Power Devices and Amplifiers," Proceedings of the IEEE, vol. 96, No. 2, pp. 287-305, Feb. 2008, DOI: 10.1109/JPROC.2007.911060.

Lenci, S., et al., "Au-Free AlGaN/GaN Power Diode on 8-in Si Substrate With Gated Edge Termination," IEEE Electron Device Letters, vol. 34, No. 8, pp. 1035-1037, Aug. 2013, DOI: 10.1109/LED.2013.2267933.

Kwan, M.H., et al., "CMOS-Compatible GaN-on-Si Field-Effect Transistors for High Voltage Power Applications," 2014 IEEE International Electron Devices Meeting, 4 pp, 2014, DOI: 10.1109/IEDM.2014.7047073.

Oh, S.K., et al., "Bonding Pad Over Active Structure for Chip Shrinkage of High-Power AlGaN/GaN HFETs," IEEE Transactions on Electron Devices, vol. 63, No. 2, pp. 620-624, Feb. 2016, DOI: 10.1109/TED.2015.2509964.

Sönmez, E., et al., "Gallium Nitride for 600V Operation," Power Electronics Europe, Issue 4, pp. 25-28, 2011.

Lee, J.H., et al. "840 V/6 A-AlGaN/GaN Schottky Barrier Diode With Bonding Pad Over Active Structure Prepared on Sapphire Substrate," IEEE Electron Device Letters, vol. 33, No. 8, pp. 1171-1173, Aug. 2012. DOI: 0.1109/LED.2012.2200450.

\* cited by examiner

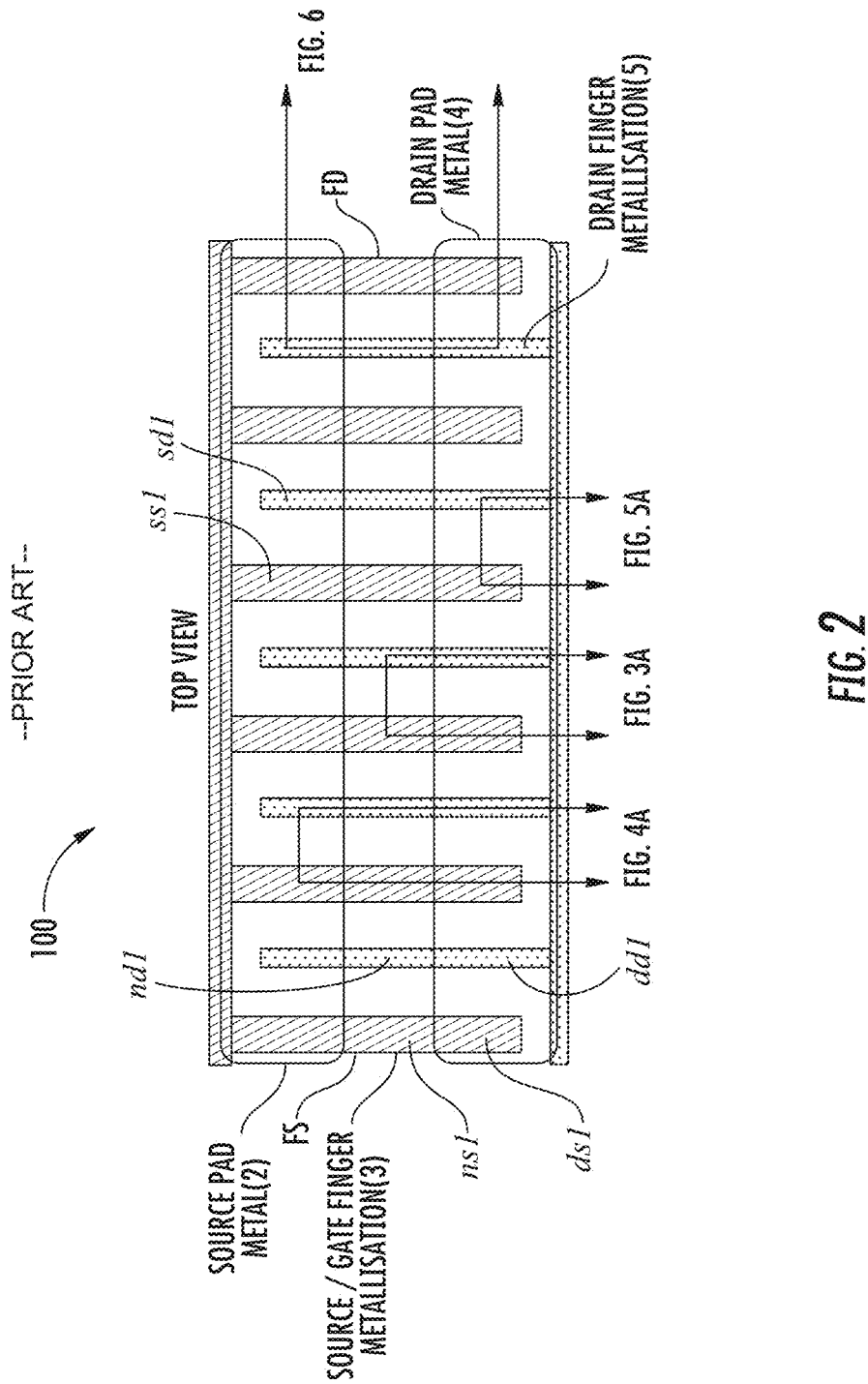

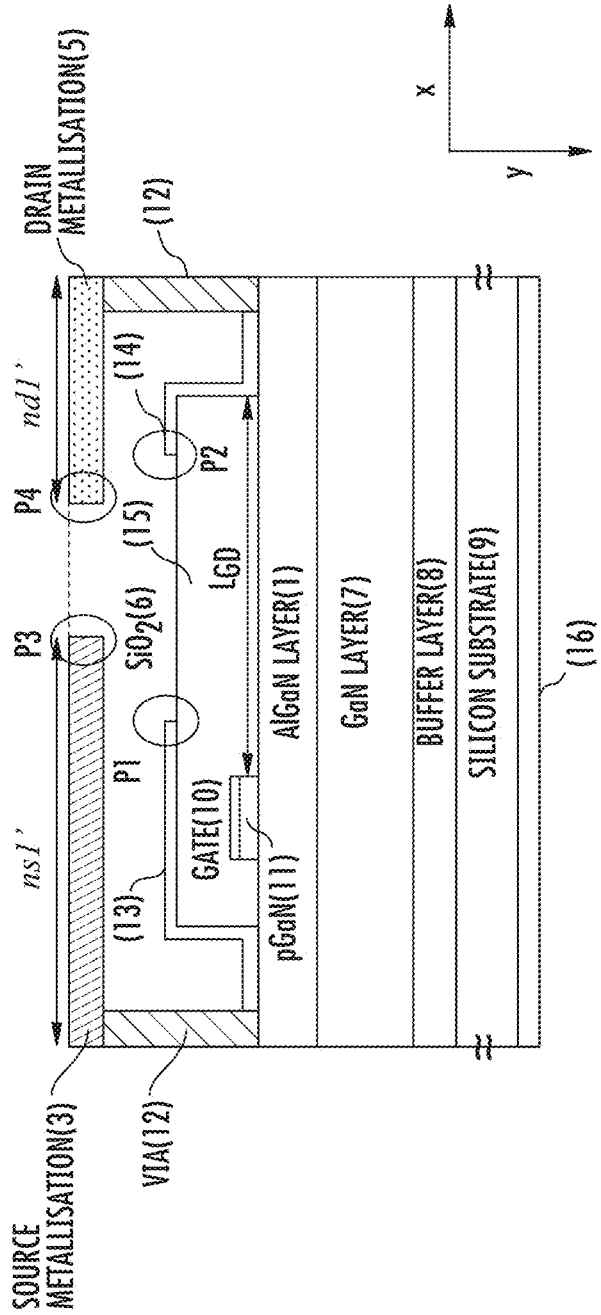
FIG. 3A —PRIOR ART—

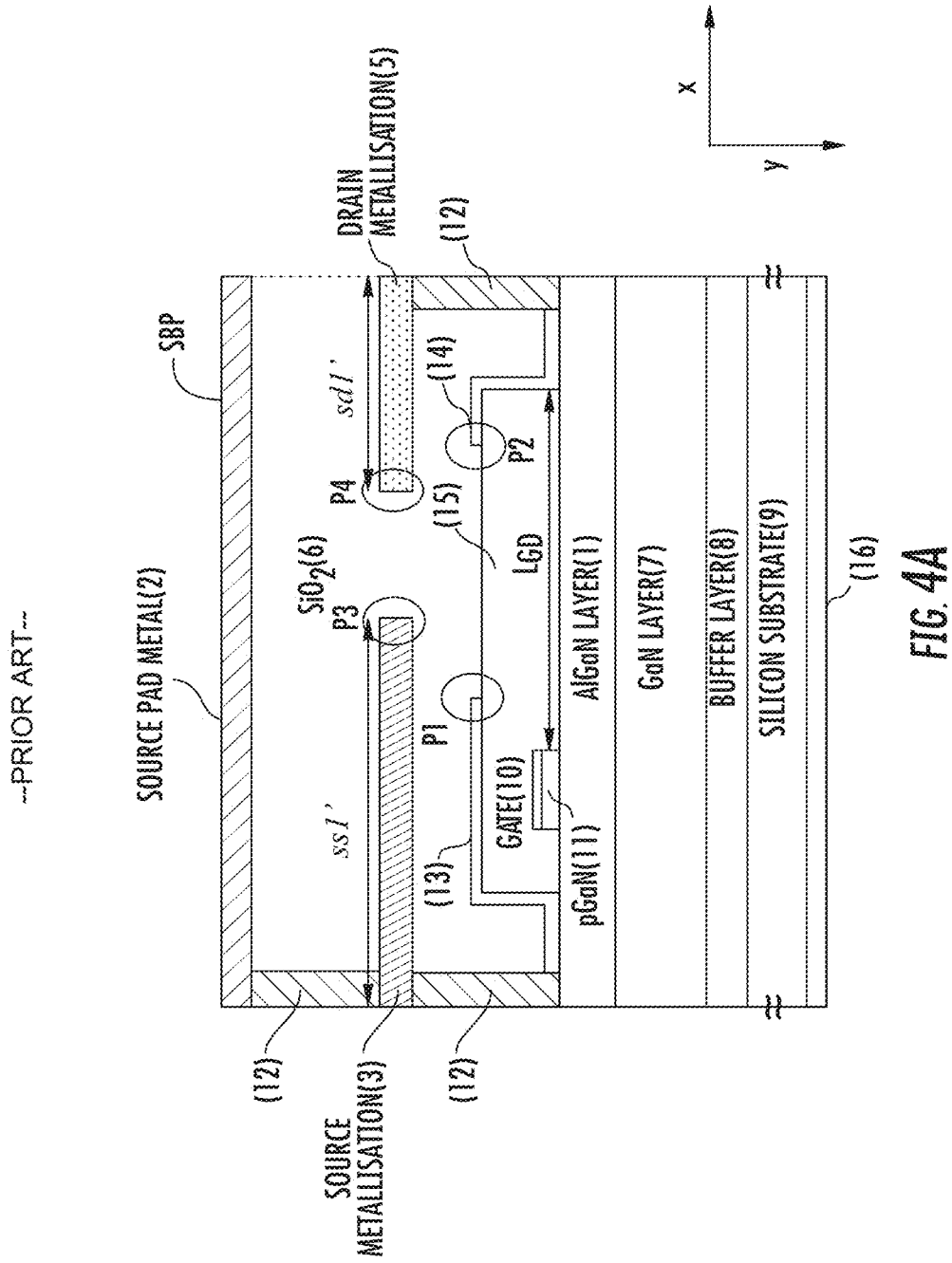

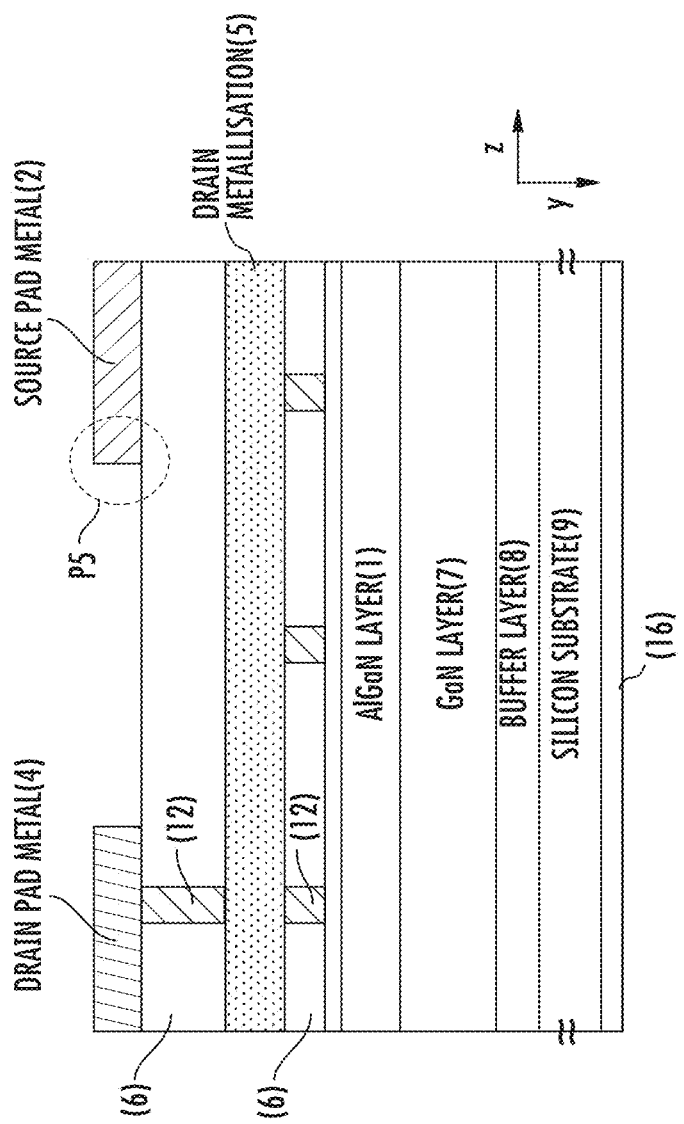

POWER SEMICONDUCTOR DEVICE WITH OPTIMIZED FIELD-PLATE DESIGN

FIELD OF THE INVENTION

The present invention relates to a power semiconductor device, such as, for example, a hetero-structure AlGaN/GaN high electron mobility transistor or rectifier, with a bonding pad over active (BPOA) area layout and an optimized field plate design.

BACKGROUND

A power semiconductor device is a semiconductor device used, for example, as a switch or rectifier in power electronics e.g., DC to AC inverter for motor control or DC to DC converter for switched-mode power supplies. A power semiconductor device is usually used in "commutation mode" i.e., it is either on or off, and therefore has a design optimized for such usage.

Silicon bipolar junction transistors BJT, Metal-Oxide-Semiconductor field effect transistors MOSFET and insulated gate bipolar transistors IGBT are common types of power semiconductor switching devices. Their application areas range from, without limitation, portable consumer electronics, domestic appliances, electric cars, motor control and power supplies to RF and microwave circuits and telecommunication systems.

In the last decade, Gallium Nitride (GaN) has increasingly been considered as a very promising material for use in the field of power devices with the potential to lead to increased power density, reduced on-resistance, and high frequency response. The wide band gap of the material $E_g$=3.39 eV results in high critical electric field Ec=3.3 MV/cm which can lead to the design of devices with a shorter drift region, and therefore lower on-state resistance, if compared to a silicon-based device with the same breakdown voltage [see U. K. Mishra et al., GaN-Based RF power devices and amplifiers, Proc. IEEE, vol 96, no 2, pp 287-305, 2008]. The use of an AlGaN/GaN heterostructure also allows the formation of a two-dimensional electron gas 2DEG at the hetero-interface where carriers can reach very high mobility $\mu$=2000 cm$^2$/Vs values [see U. K. Mishra et al., GaN-Based RF power devices and amplifiers, Proc. IEEE, vol 96, no 2, pp 287-305, 2008]. In addition, the piezopolarization charge present at the AlGaN/GaN heterostructure, results in a high electron density in the 2DEG layer e.g., 1×10$^{13}$ cm$^{-2}$. These properties can lead to the production of High Electron Mobility Transistors HEMTs and Schottky barrier diodes with very competitive performance parameters [see M. H. Kwan et al, CMOS-Compatible GaN-on-Si Field-Effect Transistors for High Voltage Power Applications, IEDM, San Fran., December 2014, pp 17.6.1-17.6.4; S. Lenci et al., Au-free AlGaN/GaN power diode 8-in Si substrate with gated edge termination, Elec. Dev. Lett., vol 34, no 8, pp 1035, 2013]. An extensive amount of research has focused on the development of power devices using AlGaN/GaN heterostructures.

Bonding Pad over active (BPOA) area layouts, as shown in FIGS. 1, 2, 3A, 4A, and 5A, have been suggested as a design feature that can improve current density in lateral AlGaN/GaN heterostructure devices and studies which show competitive on-state and off-state characteristics for such structures can be found in literature.

By way of example, FIG. 1 shows schematically a three-dimensional perspective view of an illustrative BPOA layout with an interdigitated finger geometry. In the orientation shown in FIG. 1, the x designation shows the width, the y designation shows the height, and the z designation shows the depth. FIG. 1 is an illustrative design showing the surface of the III-V semiconductor as AlGaN 1, the source pad metal 2 of a source bonding pad SBP, a source field plate designated as FS, source/gate finger metallization 3 of the source field plate FS (also referred to as the "source metallization"), a drain pad metal 4 of a drain bonding pad DBP, a drain field plate designated as FD, drain finger metallization 5 of the drain filed plate FD (also referred to as the "drain metallization") and the SiO$_2$ passivation or inter-metallization dielectric 6.

Acceptable materials for the source pad metal 2 include, but are not limited to aluminum (Al). Acceptable materials for the drain pad metal 4 include, but are not limited to aluminum (Al). Acceptable materials for the source field plate FS and the source metallization 3 include, but are not limited to titanium nitride (TiN) and aluminum (Al). Acceptable materials for the drain field plate FD and the drain metallization 5 include, but are not limited to titanium nitride (TiN) and aluminum (Al).

FIG. 2 shows schematically the top view of a BPOA layout of a semiconductor device 100 with an interdigitated finger geometry. Also designated in FIG. 2 are cross-sections shown in FIGS. 3A, 4A, 5A, and 6, described further below. Each source singer metallization 3 includes the following section: the section positioned at the source pad over active area (SPOA) having a dimension designated as ss1; the section positioned at the no pad over active area (NPOA) having a dimension designated as ns1; and the section positioned at the drain pad over active area (DPOA) having a dimension designated as ds1.

Reviewing the performance of BPOA layouts, and in particular, the reliability of BPOA designs, reveals that attention should be focused on the electric field peaks observed in the inter-metallization dielectric (e.g., SiO$_2$) when the device is biased in the off-state. Such field peaks are relevant when designing devices which are resilient to time dependent dielectric breakdown (TDDB) as high electric field in these dielectric layers can lead to increased probability of TDDB. This is especially the case where the device is exposed to high temperatures and high electric fields at the same time. TDDB depends exponentially on both temperature and the peak of the electric field. It has been observed that that the GaN based devices are meant to operate at higher junction temperatures and unlike other wide bandgap materials such as diamond or silicon carbide the thermal conductivity of GaN is lower resulting in more prominent self-heating. This is especially the case where such GaN heterostructures are grown on substrate and a thermally resistive nucleation layer such as aluminum nitride, AlN and a buffer layer are formed on top of the substrate and below the active layers to accommodate the lattice mismatch between the GaN epitaxial stack and the substrate. Such a configuration can result in additional self-heating which can make the TDDB effect even more stringent.

A distinction between different sections of a semiconductor device can be made, as seen by way of example in FIGS. 2, 3, 4, and 5. These are as follows:

FIG. 3A—No pad over active (HPOA) area;
FIG. 4A—Source pad over active (SPOA) area; and
FIG. 5A—Drain pad over active (DPOA) area.

FIGS. 3A, 4A and 5A show designated cross sections of an illustrative state of the art device as shown from the top in FIG. 2, at the noted locations and positions. Electric fields in a dielectric were simulated with off-state bias applied to the drain terminal of the device for each of these three sections, as described below.

FIGS. 3A, 4A and 5A generally show an arrangement of a state of the art BPOA semiconductor device, having a substrate 9, a buffer layer 8 above the substrate 9, a GaN layer 7 above the buffer layer 8, and a AlGaN layer 1 above the GaN layer 7. A gate terminal 10 is provided comprising a highly p-doped GaN cap 11, positioned above the AlGaN layer 1. A surface passivation dielectric 15 covers the gate 10 and is positioned between a source terminal 13 extending from a first via 12 positioned beneath the source metallization 3, and a drain terminal 14 extending from a second via 12 positioned beneath the drain metallization 5. An inter-metallization dielectric or passivation dielectric layer 6, such as an $SiO_2$ layer, is positioned above the surface passivation dielectric 15 and between the vias 12. A gate drain offset length $L_{GD}$ runs from the gate 10 to the drain terminal 14, as shown by the arrow. An optional substrate terminal 16 may be provided at a lower portion of the device, but this is not a requirement.

Acceptable materials for the inter-metallization dielectric or passivation dielectric layer 6 included, but are not limited to, silicon dioxide ($SiO_2$). Acceptable materials for the buffer layer 8 included, but are not limited to, AlN and AlGaN layers. Acceptable materials for the substrate 9 include, but are not limited to silicon (Si). Acceptable materials for the gate terminal 10 include, but are not limited to titanium nitride (TiN). Acceptable dopants for the highly p-doped GaN cap 11 include, but are not limited to, magnesium (Mg). Acceptable materials for the vias 12 include, but are not limited to tungsten (W). Acceptable materials for the source terminal 13 include, but are not limited to, titanium nitride (TiN). Acceptable materials for the drain terminal 14 include, but are not limited to, titanium nitride (TiN). Acceptable materials for the surface passivation dielectric 15 include, but are not limited to, silicon nitride (SiN). Acceptable materials for the substrate terminal 16 include, but are not limited to, silicon (Si).

FIG. 3A shows schematically the cross section taken from the area indicated in FIG. 2 in the no pad over active area (NPOA) section of a state of the art illustrative device. FIG. 3A shows a portion of the source metallization 3 having a dimension designated as ns1' (which is a portion of ns1 shown in FIG. 2) and a portion of the drain metallization 5 having a dimension designated as nd1' (which is a portion of nd1 shown in FIG. 2). The dimension ns1' corresponds to an area of a portion of the source metallization 3 in the NPOA part of the semiconductor device of FIG. 2. The dimension nd1' corresponds to an area of a portion of the drain metallization 5 in the NPOA part of the semiconductor device of FIG. 2. The specific materials shown in FIGS. 3A, 4A, and 5A, such as $SiO_2$ and GaN, are not to be construed as limiting. Those skilled in the relevant art will appreciate materials that may be used in the arrangement of a power semiconductor device having a BPOA layout.

FIG. 4A shows schematically the cross section taken from the area indicated in FIG. 2 in the source pad over active area SPOA section of a state of the art device. FIG. 4A shows a portion of the source metallization 3 having a dimension designated as ss1' (which is a portion of ss1 shown in FIG. 2) and a portion of the drain metallization 5 having a dimension designated as sd1' (which is a portion of sd1 shown in FIG. 2). The dimension ss1' corresponds to an area of a portion of the source metallization 3 in the SPOA part of the semiconductor device of FIG. 2. The dimension sd1' corresponds to an area of a portion of the drain metallization 5 in the SPOA part of the semiconductor device of FIG. 2. FIG. 4A also shows the source pad metal 2 at the top of the device.

FIG. 5A shows schematically the cross section taken from the area indicated in FIG. 2 in the drain pad over active area DPOA section of a state of the art device. FIG. 4A shows a portion of the source metallization 3 having a dimension designated as ds1' (which is a portion of ds1 shown in FIG. 2) and a portion of the drain metallization 5 having a dimension designated as dd1' (which is a portion of dd1 shown in FIG. 2). The dimension ds1' corresponds to an area of a portion of the source metallization 3 in the SPOA part of the semiconductor device of FIG. 2. The dimension dd1' corresponds to an area of a portion of the drain metallization 5 in the SPOA part of the semiconductor device of FIG. 2. FIG. 5A also shows the drain pad metal 4 at the top of the device.

As shown in FIGS. 2, 3A, 4A and 5A, each of the source metallization fingers 3 and each of the drain metallization fingers 5 have essentially the same width along their entire lengths, regardless of whether they are in the NPOA area (corresponding to dimensions ns1 and nd1), the SPOA area (corresponding to dimensions ss1 and sd1) or the DPOA area (corresponding to dimensions ds1 and dd1). It is noted that in known configurations, such as illustrated in FIGS. 2, 3A, 4A and 5A, the following dimensional conditions apply:

$$ns1=ss1=ds1$$

$$nd1=sd1=dd1$$

Reviewing the designs of FIGS. 2, 3A, 4A and 5A, it becomes apparent that the distribution of the potential is significantly altered in the regions where the active area is covered by the bonding pads. This has an effect on where the electric field peaks appear in the structure. The change in the electric field peaks observed was a factor concerning mostly the dielectric layers in the device such as layer 6 in FIGS. 3A, 4A, and 5A rather than the semiconductor layers, although there is a small effect on the field distribution at the surface of the semiconductor layer as well.

The absolute electric field contour lines were plotted for the cross sections in the distinct locations (NPOA, SPOA and DPOA) of interest in the structure. The following are illustrative examples.

FIGS. 3A and 3B show respective illustrative designs and corresponding plotted electric field measurements for the electric field peaks in $SiO_2$ at the NPOA area of the illustrated structure. In FIG. 3A, four points in the structure are labeled P1, P2, P3, and P4 indicating locations of local peaks in absolute electric field. For each of these points the magnitude of the corresponding electric field peak is shown in FIG. 3B.

FIGS. 4A and 4B show respective illustrative designs and corresponding plotted electric field measurements for the electric field peaks in $SiO_2$ at the SPOA area of the illustrated structure. In FIG. 4A, four points in the structure are labeled P1, P2, P3, and P4 indicating locations of local peaks in absolute electric field. For each of these points the magnitude of the corresponding electric field peak is shown in FIG. 4B.

FIGS. 5A and 5B show respective illustrative designs and corresponding plotted electric field measurements for the electric field peaks in $SiO_2$ at the DPOA area of the illustrated structure. In FIG. 5A, four points in the structure are labeled P1, P2, P3, and P4 indicating locations of local peaks in absolute electric field. For each of these points the magnitude of the corresponding electric field peak is shown in FIG. 5B.

Principal areas of concern can be identified in these plots as seen in FIGS. 3A and 3B with respect to the NPOA section, FIGS. 4B and 4B with respect to the SPOA section, and FIGS. 5A and 5B with respect to the DPOA section. The peaks that arise in the source pad (SPOA) and the drain pad (DPOA) covered regions are much higher than those observed in a region with no pad cover (NPOA). A maximum value of 7.0 MV/cm was observed in the DPOA section and a maximum value of 6.1 MV/cm was observed in the SPOA section, compared to the maximum value of 5.7 MV/cm observed in the NPOA section.

It has thus been observed that the maximum electric field peaks observed in the dielectric layers and the surface of the semiconductor can vary depending on the section of the device investigated.

Furthermore, it has been found that a high electric field may be present in the z-dimension due to the placement of the pads on the active area of the device. These locations cannot be modeled with the use of the standard 2D cross section simulation model, and therefore 3D TCAD simulations were employed to identify critical areas. FIG. 6 shows schematically a cross section along the finger metallization direction for the illustrative state of the art device of FIG. 2. One point identified as a possible concern with a BPOA structure is at the edge of the source contact pad, see P5 in FIG. 6. A similar peak can be observed at the drain contact pad edge.

BPOA layout can lead to reliability problems, among which the time dependent dielectric breakdown (TDDB) is of a significant concern especially during long term operation, high field operation and high temperature operation.

This concern arises as bonding pads over the active area change the way in which the potential is distributed in the structure when biased compared to a conventional finger structure interdigitated structure without pads over the active area. High electric fields cannot only harm the semiconductor but also the inter-metallization dielectric layers used and can lead to reliability issues such as TDDB.

To reduce the risk for TDDB, the electric field peaks in the dielectric layer must be minimized through smart field plate designs disclosed herein.

The present invention is directed to alternative structures and methods which aim at lessening the electric field peaks both within the dielectric and at the surface of the semiconductor device.

In another aspect, the electric field peaks are minimized within the dielectric layers in the third dimension (z-direction) of the semiconductor device.

The several aspects of the invention are based on re-optimizing and therefore changing the dimensions of the field plates, such as in the x or z directions, according to whether there is no pad placed directly above them, or if a low voltage source pad is placed above them, or a high voltage drain pad is placed above them.

SUMMARY OF THE INVENTION

A power semiconductor device and method for making same are disclosed. The device includes a source bonding pad and a drain bonding pad, a drain metallization structure including a drain field plate connected to the drain bonding pad, and a source metallization structure comprising a source field plate connected to the source bonding pad. At least a portion of at least one of the bonding pads is situated directly over an active area. A dimension of at least one of the field plates varies depending upon a structure adjacent to that field plate. The structure adjacent the field plate may be a bonding pad positioned above the field plate at a particular location.

In yet another aspect of the invention, a semiconductor device comprising a source bonding pad, a drain bonding pad, a drain metallization structure comprising a drain field plate, and a source metallization structure comprising a source field plate. At least a portion of at least one of the bonding pads is situated directly over an active area of the device. A dimension of at least one of the field plates varies depending upon the adjacent structure.

In yet another aspect of the invention, a semiconductor device is provided. A first portion of the semiconductor device comprises a source pad over active area and includes a source pad metal. A second portion of the semiconductor device comprises a no pad over active area. A third portion of the semiconductor device comprises a drain paid over active area and includes a drain pad metal. A source metallization field plate has portions positioned in the first, second and third portions of the semiconductor device. The source metallization field plate has a dimension positioned in at least one of the portions of the semiconductor device that is different from a dimension positioned in at least one of the other portions of the semiconductor device. A drain metallization field plate has portions positioned in the first, second and third portions of the semiconductor device. The drain metallization field plate has a dimension positioned in at least one of the portions of the semiconductor device that is different from a dimension positioned in at least one of the other portions of the semiconductor device.

In another aspect of the present invention, a semiconductor device having a BPOA layout is provided comprising a source bonding pad and a drain bonding pad, a drain metallization structure comprising a drain field plate connected to the drain bonding pad, and a source metallization structure comprising a source field plate connected to the source bonding pad. At least a portion of at least one of the bonding pads is situated directly over an active area of the device. A dimension of at least one of the field plates varies depending upon the structure adjacent to that field plate.

In another aspect of the present invention, a semiconductor device having a BPOA layout is provided, wherein a field plate is provided having metallization fingers. The dimensions of the metallization fingers have portions that have varying dimensions with respect to whether those portions are in a no pad over active (NPOA) area, a source pad over active (SPOA) area, or a drain pad over active (DPOA) area of the device.

According to another aspect of the invention, a heterostructure III-V semiconductor based device, such as a III-nitride based device, is provided with at least one bonding pad over at least one active area. Portions of the field plates, such as portions of the field plates comprising metallized finger structures, in the active area have different dimensions in a region under the said at least one bonding pad compared to a region where there is no pad present above such a region, such that at least one electric field peak is reduced in the dielectric layers compared to those in the case where an identical field plate design is employed irrespective of the presence or the absence of a bonding pad above the interdigitated structure in the active area.

In yet another aspect of the present invention, a method for reducing electric field strength within a semiconductor device is provided. The method comprises fabricating metal field plates, with each metal field plate having at least one dimension that varies based on a position of the metal field plates within the device and a corresponding structure of the device adjacent to the metal field plates at a particular position.

In yet another aspect of the present invention, a semiconductor device having a BPOA layout is provided, including field plates above and extending beyond the inner edges of the bonding pads.

In yet another aspect of the present invention, a semiconductor device is provided including a drain pad metal, and a drain pad field plate positioned directly above the drain pad metal. The drain pad field plate has an extension portion extending beyond an inner edge of the drain pad metal. A source pad metal is provided. A source pad field plate is positioned directly above the source pad metal. The source pad field plate has an extension portion extending beyond an inner edge of the source pad metal.

DESCRIPTION OF DRAWINGS

Embodiments of the invention are illustrated by way of example and not by way of limitation in the accompanying drawings and in which like reference numerals refer to similar elements.

FIG. 2 shows a top view of a state of the art semiconductor device having a BPOA layout.

FIG. 3A shows a cross-section of the device of FIG. 2 taken along the designated area of FIG. 2.

FIG. 4A shows a cross-section of the device of FIG. 2 taken along the designated area of FIG. 2.

FIG. 6 shows a cross-section of the device of FIG. 2 taken along the designated area of FIG. 2.

DETAILED DESCRIPTION

Figure 1:
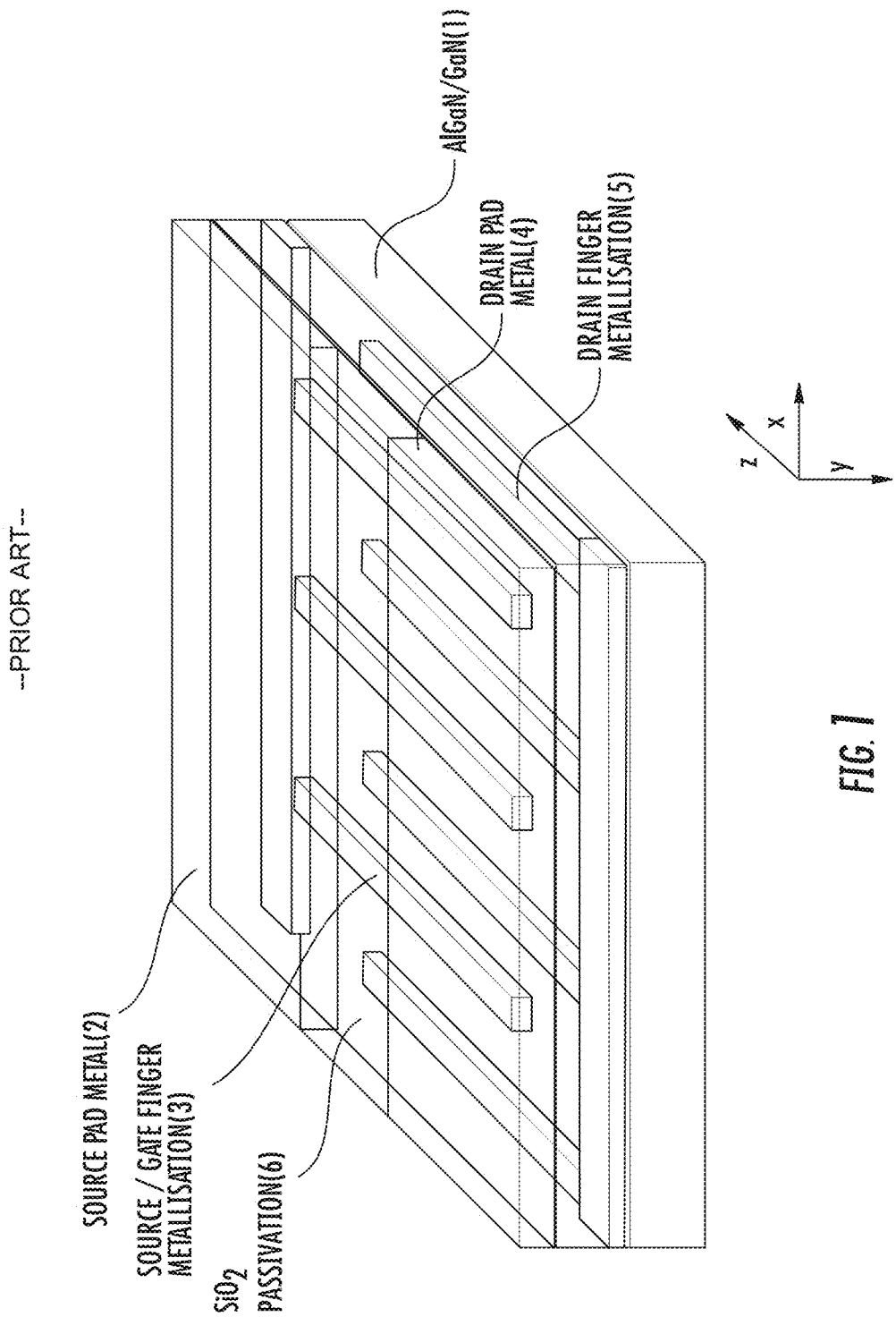
FIG. 1 shows a perspective view of a state of the art semiconductor device.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

Disclosed herein are embodiments of power semiconductor devices with a bonding pad over an active area (BPOA) layout. A field plate configuration is provided configured to reduce electric field peaks in order to protect the inter-metallization dielectric or passivation dielectric and a semiconductor surface when a device operates in the off-state, under high electric fields. In an embodiment, a power semiconductor device has a variable optimized field plate structure above with an active area below. In another embodiment, field plates are added above and extending beyond inner portions of bonding pad edges, to reduce the electric field observed at those positions.

Figure 7:
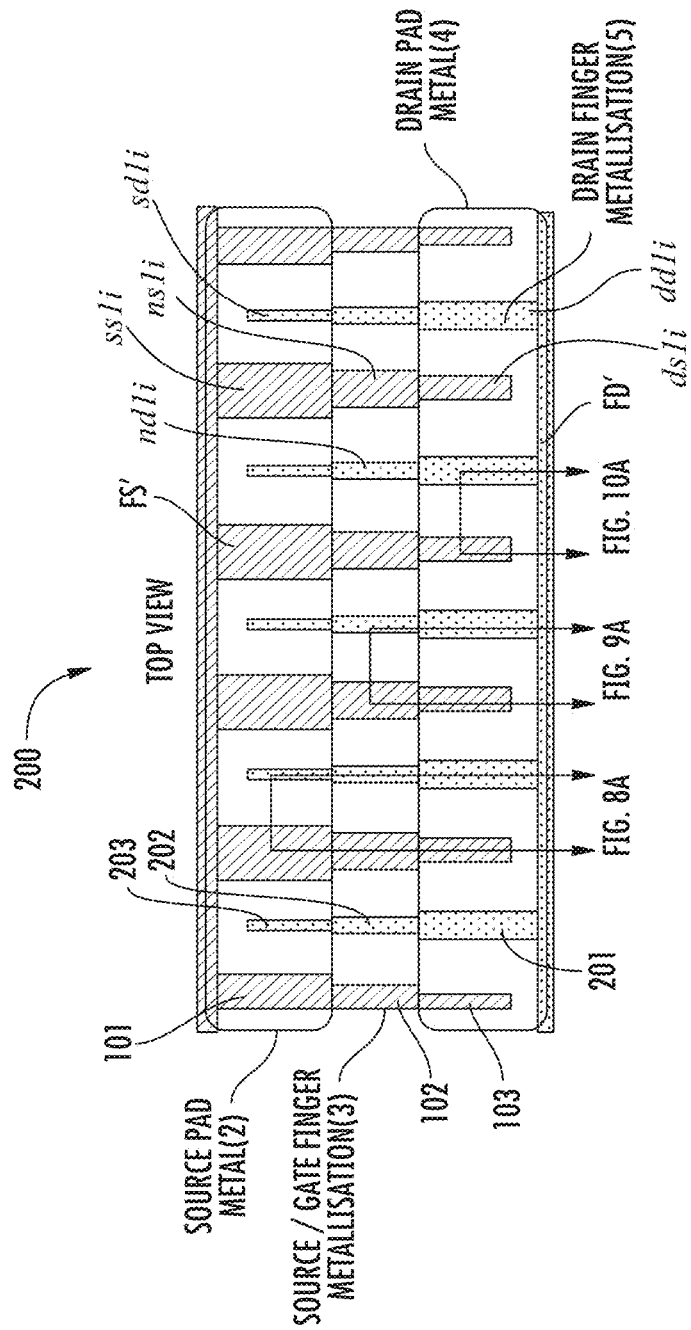
FIG. 7 shows a top view of an embodiment of a semiconductor device according to the invention having a BPOA layout.

FIG. 7 shows schematically the top view of an embodiment of the invention, showing a power semiconductor device 200 having a BPOA layout. A source field plate FS' is fabricated having source finger metallization 3' and a drain field plate FD' is fabricated having drain finger metallization 5'.

The source finger metallization 3' has a first portion 101 under the source pad metal 2' (a SPOA section) of a source bonding pad SBP', a second portion 102 having no pad over it, that is not under either the source pad metal 2' or the drain pad metal 4' (a NPOA section) of a drain bonding pad DBP', and a third portion 103 under the drain pad metal 4' (a DPOA section). The drain finger metallization 5' has a first portion 201 under the drain pad metal 4' (a DPOA area or section), a second portion 202 having no pad over it, that is not under either the drain pad metal 4' or the source pad metal 2' (a NPOA area or section), and a third portion 203 under the source pad metal 2' (a SPOA area or section).

A dimension of the different portions of the finger metallizations can be varied along the length of each such finger metallization, depending of the location of that portion as compared to adjacent structures of the device. The dimension of a portion or section of a finger metallization may be considered to be the area, the length, the width, the thickness or height, the volume, or any combination of any of those parameters.

As shown in FIG. 7, a dimension, in this example the width in the x direction, of the finger metallization of a field plate is constant when the structure directly above that field plate is of a certain type. At the same time, the dimension of the finger metallization may differ or vary when different structures (e.g., different pad structures, such as in the source pad metal in the SPOA area, or the drain pad metal in the DPOA area) are above, or not above (as in the NPOA area), a particular field plate structure.

In the example shown in FIG. 7, a dimension of the source finger metallization 3' of a source metal field plate FS' has a dimension value when the field plate is under a source bonding pad (e.g., a particular width), a smaller dimension value when under no bonding pad (e.g., a smaller relative width), and a still smaller dimension value when under a drain bonding pad (e.g., a smallest relative width). Similarly, in the example shown in FIG. 7, a dimension of the drain finger metallization 5' of a drain metal field plate FD' has a dimension value when the field plate is under a drain bonding pad (e.g., a particular width), a smaller value when under no bonding pad (e.g., a smaller relative width), and a still smaller value when under a source bonding pad (e.g., a smallest relative width). FIG. 7 also shows cross-sectional cut lines for the views shown in FIGS. 8A, 9A, and 10A, discussed further below.

As shown in FIG. 7, the first portion 101 of the source finger metallization 3', has a dimension (ss1$i$) that is greater than the dimension (ns1$i$) of the second portion 102. The first portion 101 of source finger metallization 3' also has a dimension (ss1$i$) that is greater than the dimension (ds1$i$) of the third portion 103. The second portion 102 has a dimension (ns1) greater than the dimension (ds1$i$) of the third portion 103. Thus, the dimension of the first portion 101>the dimension of the second portion 102>the dimension of the third portion 103. Accordingly, in the illustrated example, ss1$i$>ns1>ds1$i$.

In the embodiment shown in FIG. 7, the first portion 201 of the drain finger metallization 5' has a dimension (dd1$i$) that is greater than the dimension (nd1$i$) of the second portion 202. The first portion 201 of drain finger metallization 5' has a dimension (dd1$i$) that is also greater than the dimension (sd1$i$) of the third portion 203. The second portion 202 has a dimension (nd1$i$) greater than the dimension (sd1$i$) of the third portion 203. Thus, the dimension of the first portion 201>the dimension of the second portion 202>the dimension of the third portion 203. Accordingly, in the illustrated example, dd1$i$>nd1$i$>dd1$i$.

It should be noted that the dimensions ss1$i$, ns1$i$ and ds1$i$ could be varied in different ways, such that ss1$i$≠ns1$i$≠ds1$i$, and the dimensions dd1$i$, nd1$i$ and dd1$i$ could be varied in different ways, such that dd1$i$≠nd1$i$≠dd1$i$.

Figure 8A:
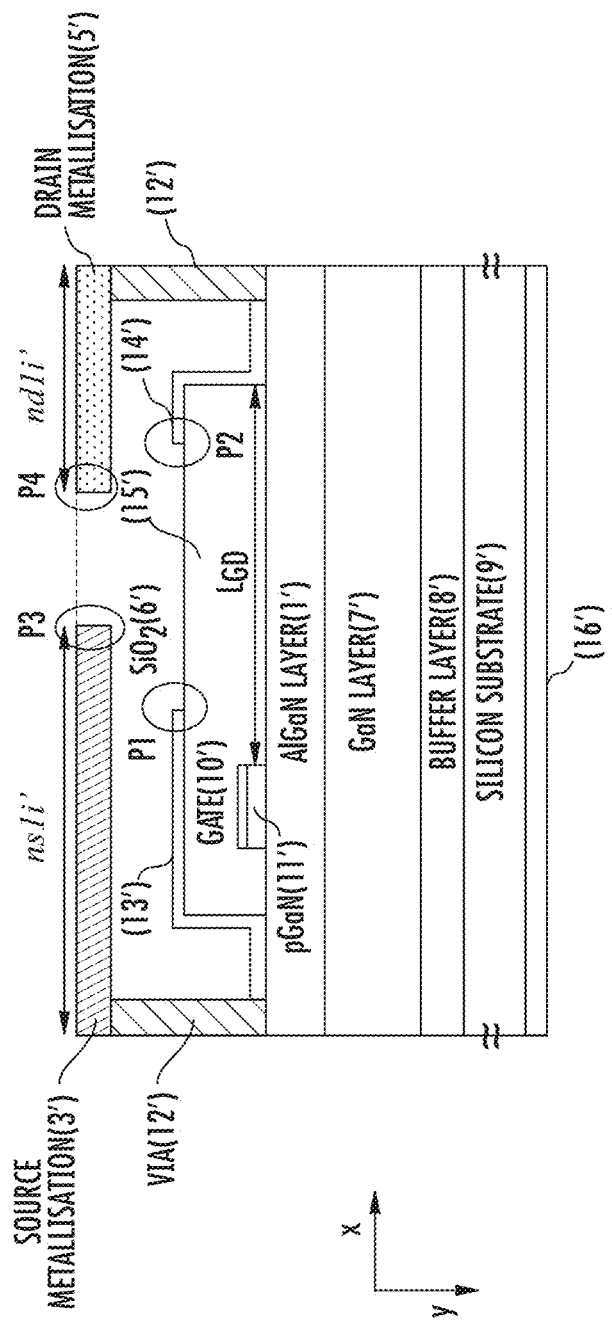
FIG. 8A shows a cross section of the embodiment of FIG. 7 taken along the designated area of FIG. 7.
Figure 9A:
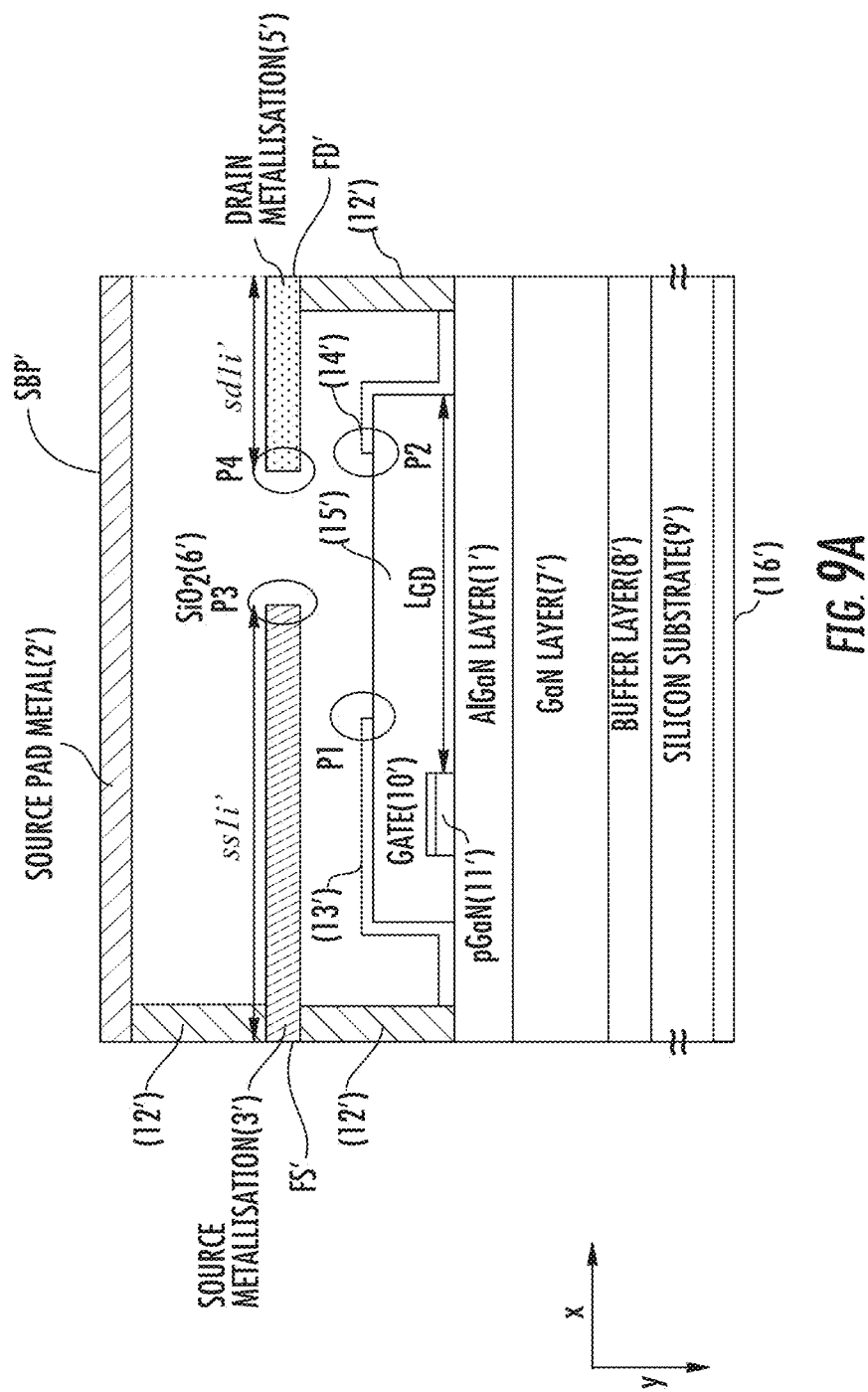
FIG. 9A shows a second cross section of the embodiment of FIG. 7 with specific points related to measurements labeled.
Figure 10A:
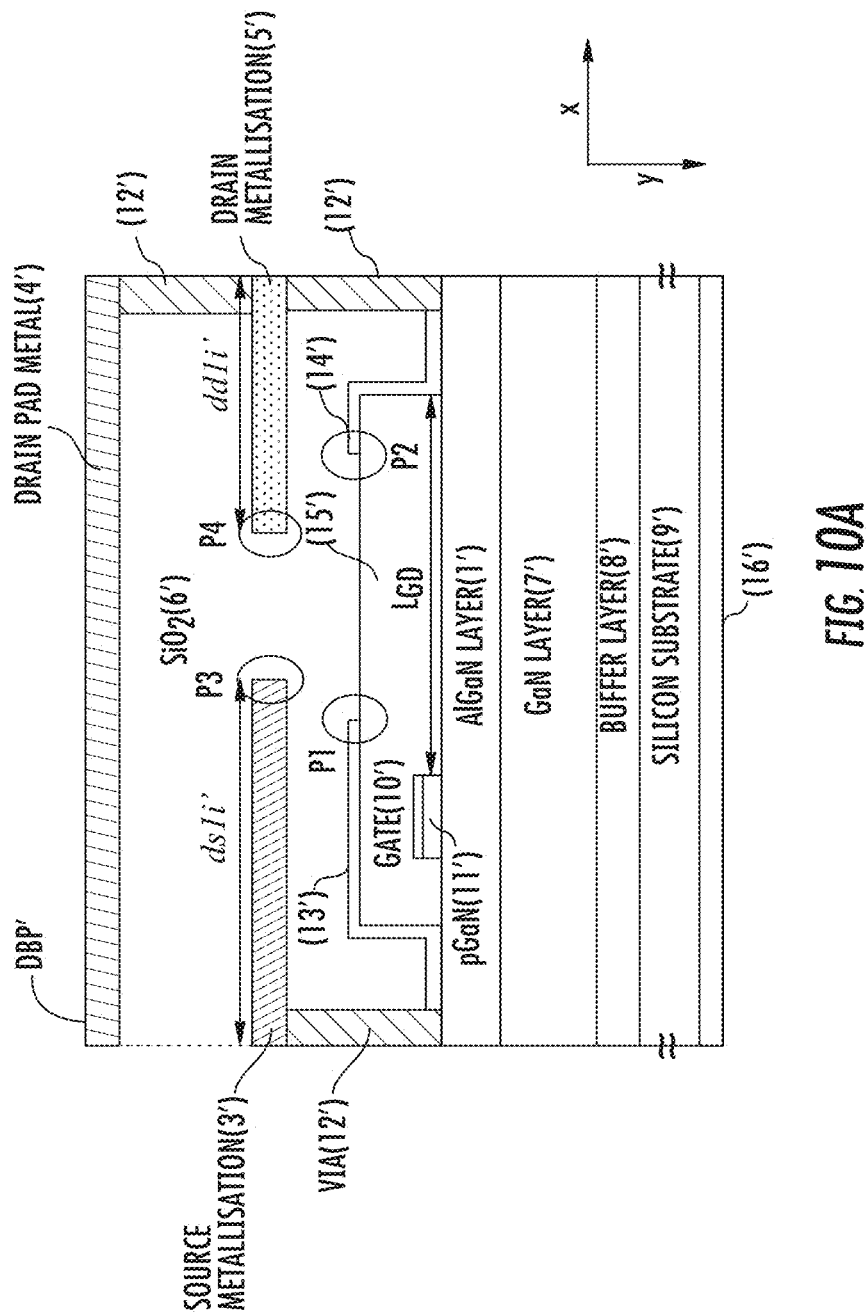
FIG. 10A shows a third cross section of the embodiment of a semiconductor device of FIG. 7 with specific points related to measurements labeled.

FIGS. 8A, 9A and 10A generally show an arrangement of a BPOA semiconductor device according to teachings of the invention, having a substrate 9', a buffer layer 8' above the substrate 9', a GaN layer 7' above the buffer layer 8', and a AlGaN layer 1' above the GaN layer 7'. A gate terminal 10' is provided comprising a highly p-doped GaN cap 11', positioned above the AlGaN layer 1'. A surface passivation dielectric 15' covers the gate 10' and is positioned between a source terminal 13' extending from a first via 12' positioned beneath the source metallization 3', and a drain terminal 14' extending from a second via 12' positioned beneath the drain metallization 5'. An inter-metallization dielectric or passivation dielectric layer 6', such as an SiO$_2$ layer, is positioned above the surface passivation dielectric 15' and between the vias 12'. A gate drain offset length $L_{GD}$ runs from a side of the gate 10' to the drain terminal 14', as shown by the arrow. An optional substrate terminal 16' may be provided at a lower portion of the device, but this is not a requirement. The various materials forming the illustrated elements, components and layers of FIG. 7 may be similar to those as described with respect to FIGS. 2, 3A, 4A, 5A and 6.

FIGS. 8A and 8B, 9A and 9B, and 10A and 10B, show the designs and respective results after the source and drain metallization field plate structures were optimized according to the teachings herein. Comparisons were made with the results in FIGS. 3A and 3B, 4B and 4B, and 5A and 5B, which were obtained from the illustrative state of the art devices analyzed and discussed above.

FIG. 8A shows a cross sectional view of the NPOA area of the power semiconductor device having a BPOA layout as shown in FIG. 7, taken along the indicated cross-sectional area of FIG. 7. The NPOA section corresponds to the second portion 102 of the source finger metallization 3' and the second portion 202 of the drain finger metallization 5'. In this NPOA area cross section, the source field plate FS has a dimension at the source finger metallization 3 of ns1$i'$ (which corresponds to a portion of ns1$i$ shown in FIG. 7) and the drain field plate has a dimension at the drain finger metallization 5 of nd1$i'$ (which corresponds to a portion of nd1$i$ shown in FIG. 7).

Figure 8B:
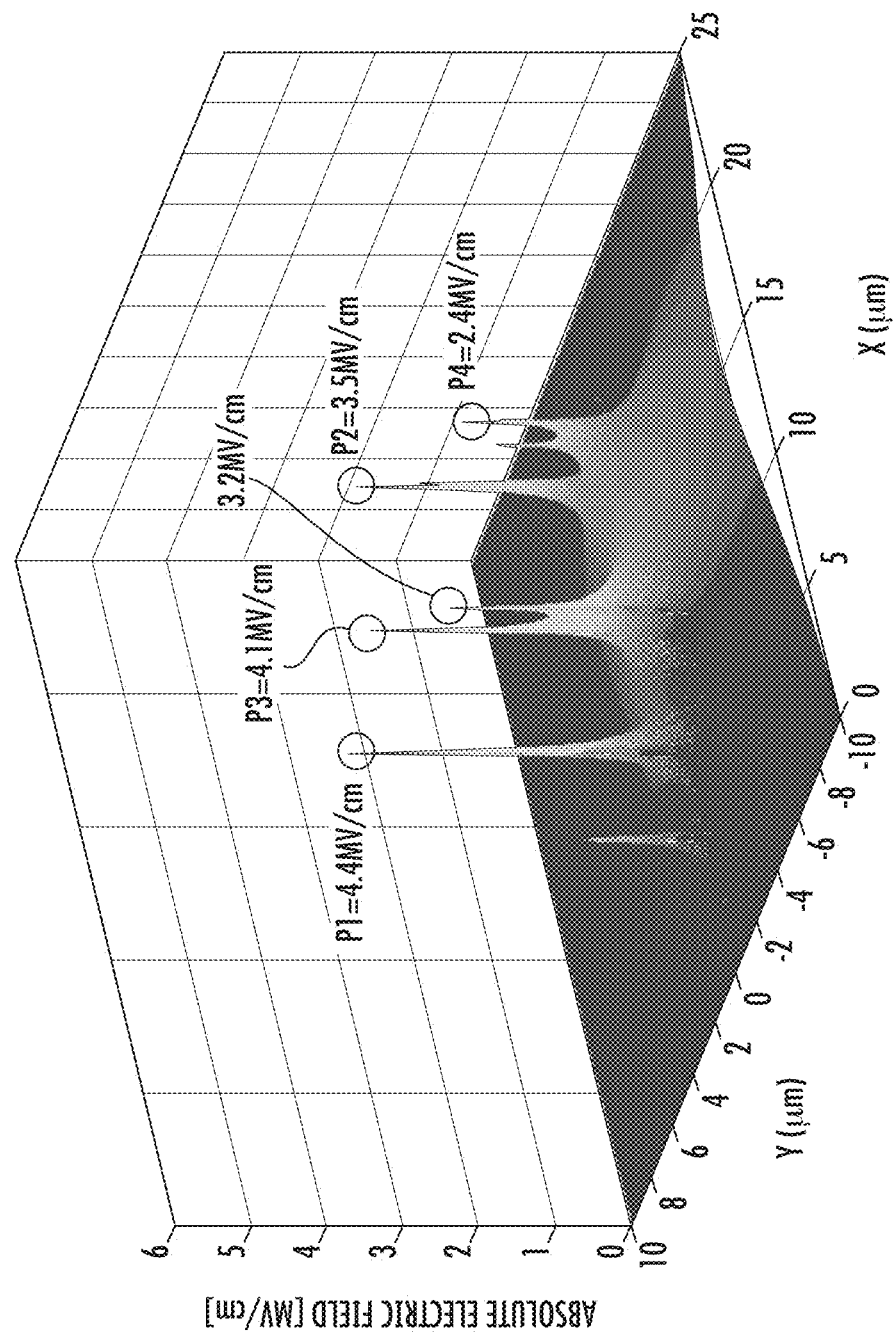
FIG. 8B shows a plot of absolute electric field within the structure of FIG. 8A.

As shown in FIG. 8A, various points in the structure are identified as P1, P2, P3, and P4. FIG. 8B shows the corresponding electric field peaks in SiO$_2$ at the points P1, P2, P3, P4 in an NPOA section of the structure of the device shown in FIG. 8A.

FIG. 9A shows an embodiment of the device as shown in FIG. 7, including a cross section of the SPOA area. As shown in FIG. 9A, an upper source pad metal 2' is positioned above a source field plate FS' including source metallization 3', with a via 12' provided between the source pad metal 2' and the source metallization 3'. A source field plate FS' is fabricated having source finger metallization 3' and a drain field plate FD' is fabricated having drain finger metallization 5'. The SPOA section corresponds to the first portion 101 of the source finger metallization 3' and the third portion 203 of the drain finger metallization 5'. In this SPOA area cross section, the source field plate FS' has a dimension at the source finger metallization 3' of ss1$i'$ (which corresponds to a portion of ss1$i$ shown in FIG. 7) and the drain field plate has a dimension at the drain finger metallization 5' of sd1$i'$ (which corresponds to a portion of sd1$i$ shown in FIG. 7).

Dimensions ss1$i$ may be distinct from dimension ns1$i$, and dimension sd1$i$ may be distinct from dimension nd1$i$. For example, in the illustrated example of an SPOA section, at least the width of section 101 of the source finger metallization 3' is greater than the width of section 102 of the source finger metallization 3'. In that instance, the dimension ss1$i$>the dimension ns1$i$. In the illustrated example of an SPOA section, at least the width of section 202 of the drain finger metallization 5' is greater than the width of section 203 of the drain finger metallization 5'. In that instance, the dimension nd1$i$>the dimension sd1$i$.

Figure 9B:
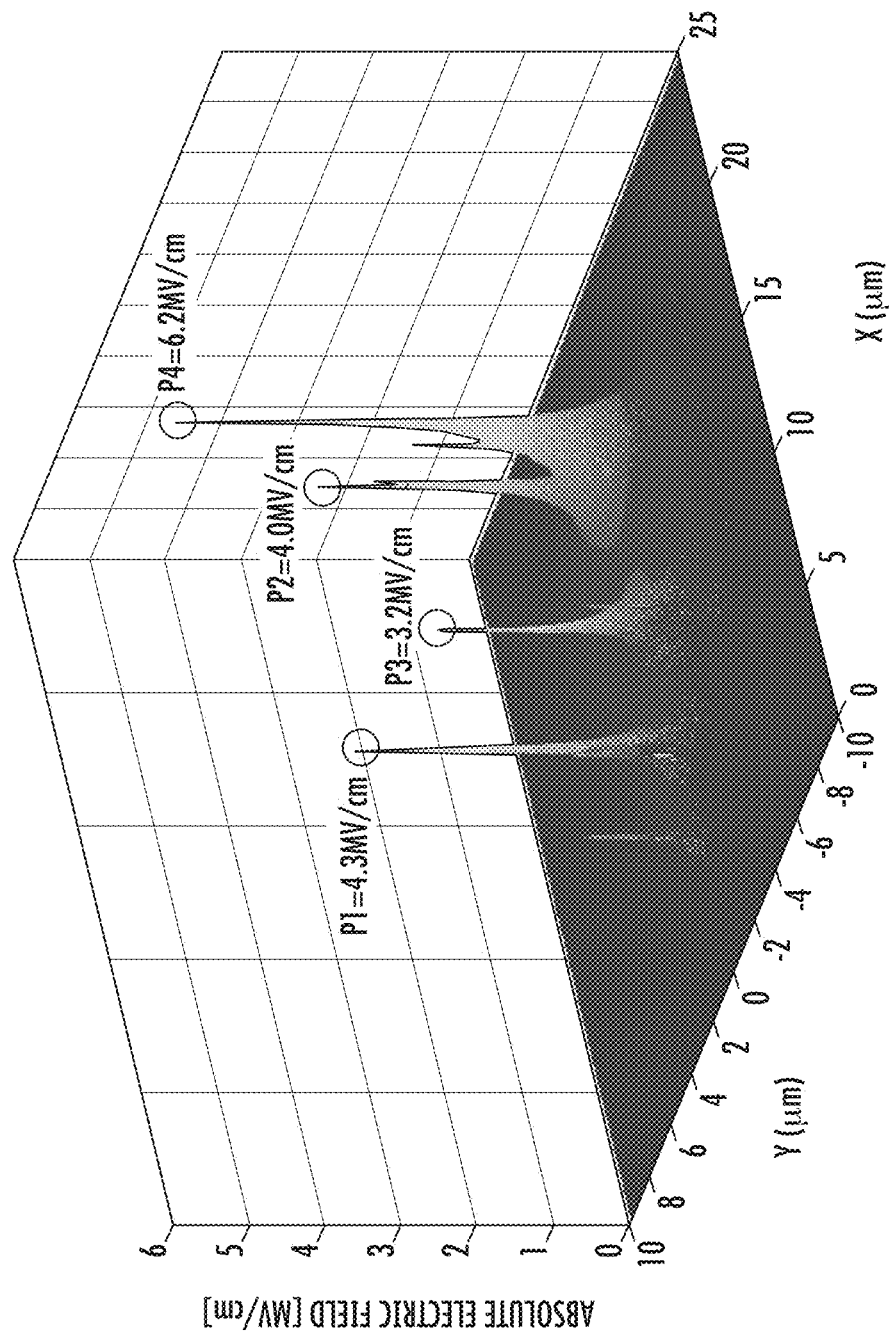
FIG. 9B shows a plot of absolute electric field within the structure of FIG. 9A.

As shown in FIG. 9A, various points in the structure are identified as P1, P2, P3, and P4. FIG. 9B shows the corresponding electric field peaks in SiO2 at the points P1, P2, P3, and P4 in an SPOA section of the structure for the device of FIG. 9A.

FIG. 10A shows an embodiment of the device according to FIG. 7, including a cross section of the DPOA area. As shown in FIG. 10A, an upper drain pad metal 4' is positioned above the drain metallization 5', with a via 12' provided between the drain pad metal 4' and the drain metallization 5'. A field plate FS' is fabricated having source finger metallization 3' and another field plate FD' is fabricated having drain finger metallization 5'. The DPOA section corresponds to the third portion 103 of the source finger metallization 3' and the first portion 201 of the drain finger metallization 5'. In this SPOA area cross section, the source field plate has a dimension at the source finger metallization 3' of ds1$i$' (which corresponds to a portion of ds1$i$ shown in FIG. 7) and the drain field plate has a dimension at the drain finger metallization 5' of dd1$i$' (which corresponds to a portion of dd1$i$ shown in FIG. 7).

Dimension ds1$i$ may be distinct from dimensions ns1$i$ and/or ss1$i$. For example, in the illustrated example of a DPOA section, at least the width of section 103 of the source finger metallization 3' is less than the width of section 102 of the source finger metallization 3', and less than the width of section 101 of the source finger metallization 3'. In that instance, the dimension ss1$i$>the dimension ns1$i$>the dimension ds1$i$.

Dimension dd1$i$ may be distinct from dimensions nd1$i$ and/or sd1$i$. For example, in the illustrated example of a DPOA section, at least the width of section 201 of the drain finger metallization 5' is greater than the width of section 202 of the drain finger metallization 5', and greater than the width of section 203 of the source finger metallization 5'. In that instance, the dimension dd1$i$>the dimension nd1$i$>the dimension sd1$i$.

Figure 10B:
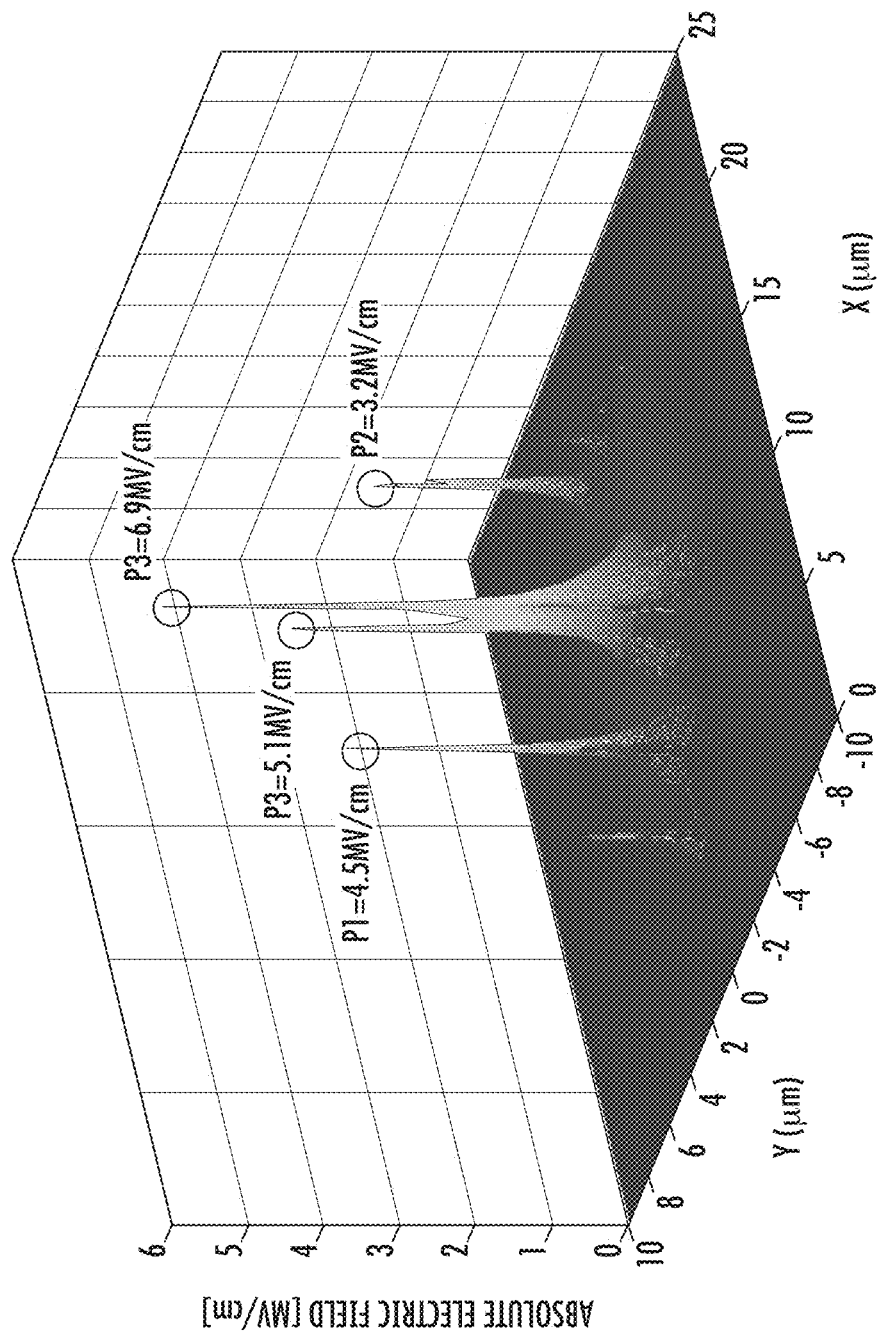
FIG. 10B shows a plot of absolute electric field within the structure of FIG. 10A.

As shown in FIG. 10A, various points in the structure are identified as P1, P2, P3, and P4. FIG. 10B shows the corresponding electric field peaks in SiO$_2$ at the points P1, P2, P3, and P4 in a DPOA section of the structure for a device employing the field plate structure described herein.

A reduction in the electric field peaks observed in the inter-metallization dielectric in all three different sections of a power semiconductor device as previously identified (NPOA, SPOA, DPOA), assuming that both the high voltage pad drain and the low voltage pad source are placed over the active area, may be achieved according to arrangements disclosed herein.

Figure 3B:
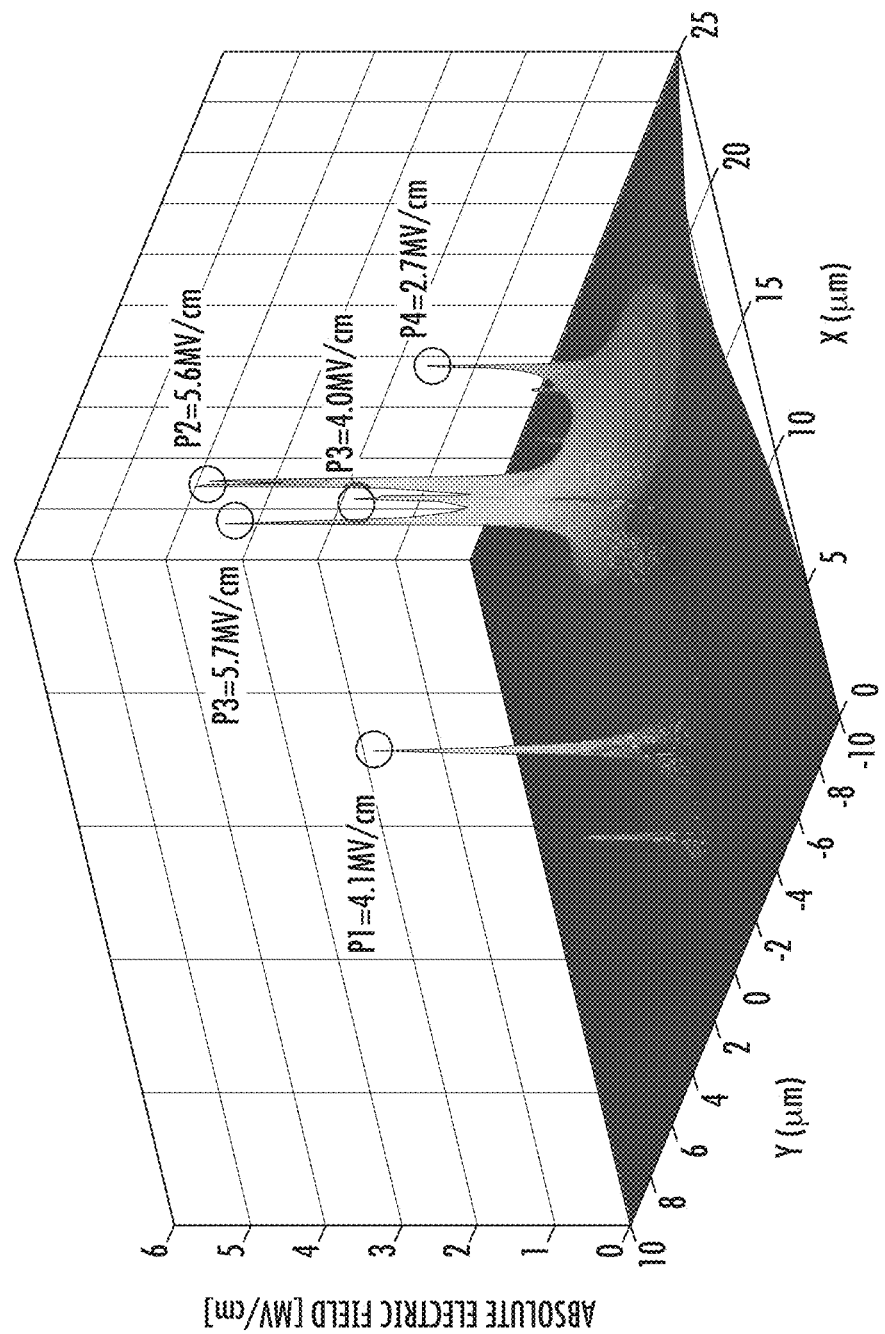
FIG. 3B shows a plot of absolute electric field within the structure of FIG. 3A.

For example, comparing the measured electric field peaks of a state of the art NPOA section as shown in FIG. 3A to the electric field peaks of a device according to the teachings of the invention as shown in FIG. 8A shows a reduction in electric field peaks. As shown in the plotted measurements of FIGS. 3B and 8B, the plotted measurements related to point P2 showed a reduction in electric field peak from 5.6 MV/cm to 3.5 MV/cm. The plotted measurements of point P3 showed a reduction in electric field peak from 5.7 MV/cm to 4.1 MV/cm. The plotted measurements of point P4 showed a reduction in electric field peak from 2.7 MV/cm to 2.4 MV/cm.

Figure 4B:
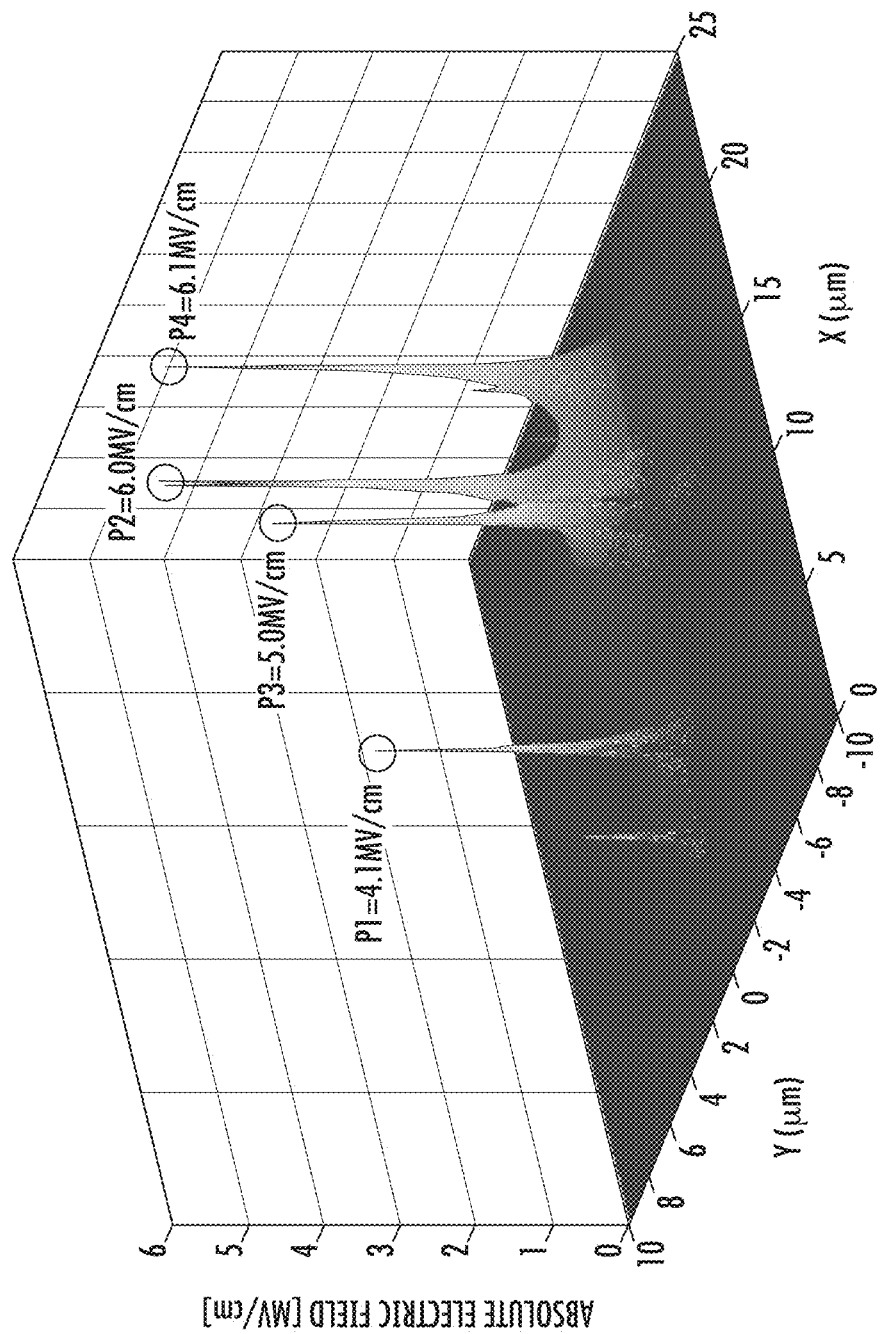
FIG. 4B shows a plot of absolute electric field within the structure of FIG. 4B.

Comparing the measured electric field peaks of a state of the art SPOA section as shown in FIG. 4A to the electric field peaks of a device according to the teachings of the invention as shown in FIG. 9A shows a reduction in electric field peaks. As shown in the plotted measurements of FIGS. 4B and 9B, the plotted measurements related to point P2 showed a reduction in electric field peak from 6.0 MV/cm to 4.0 MV/cm. The plotted measurements of point P3 showed a reduction in electric field peak from 5.0 MV/cm to 3.2 MV/cm.

Figure 5A:
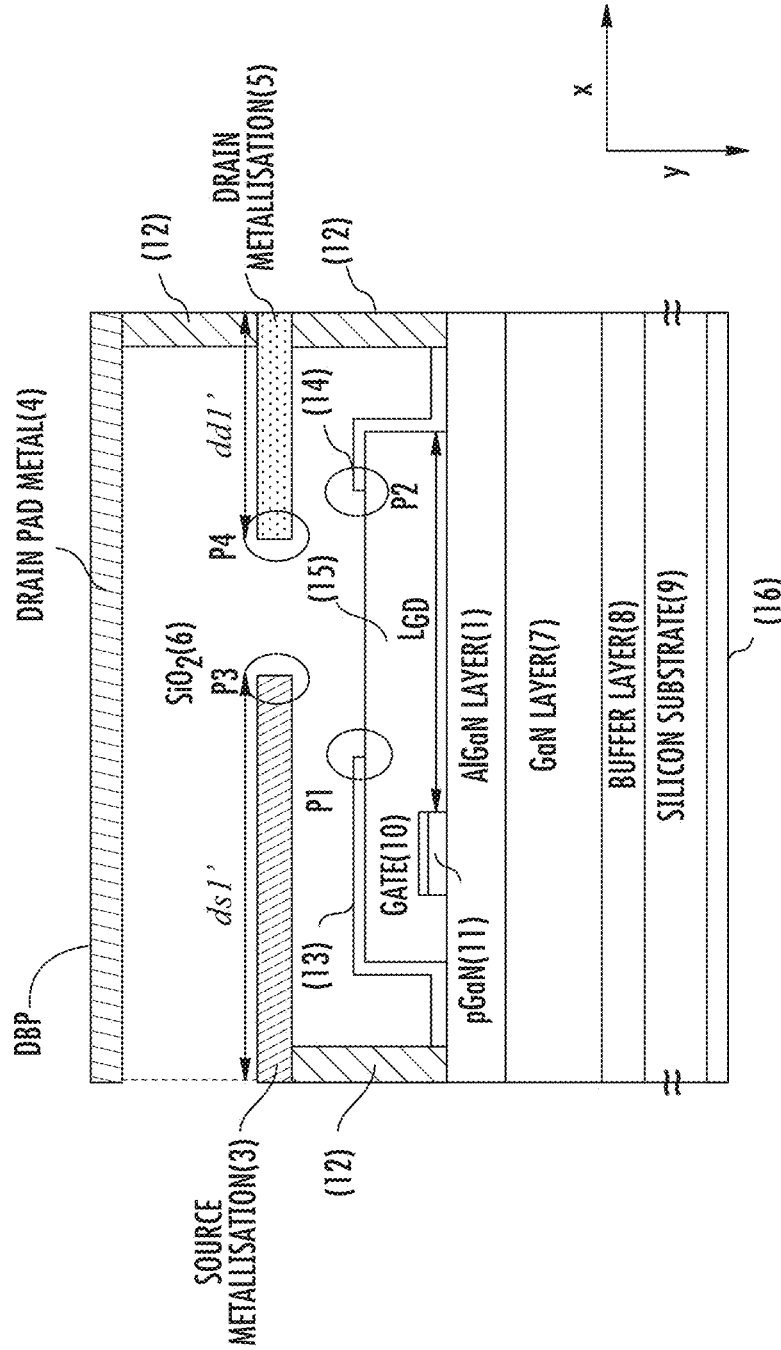
FIG. 5A shows the cross-section of the device of FIG. 2 taken along the designated area of FIG. 2.
Figure 5B:
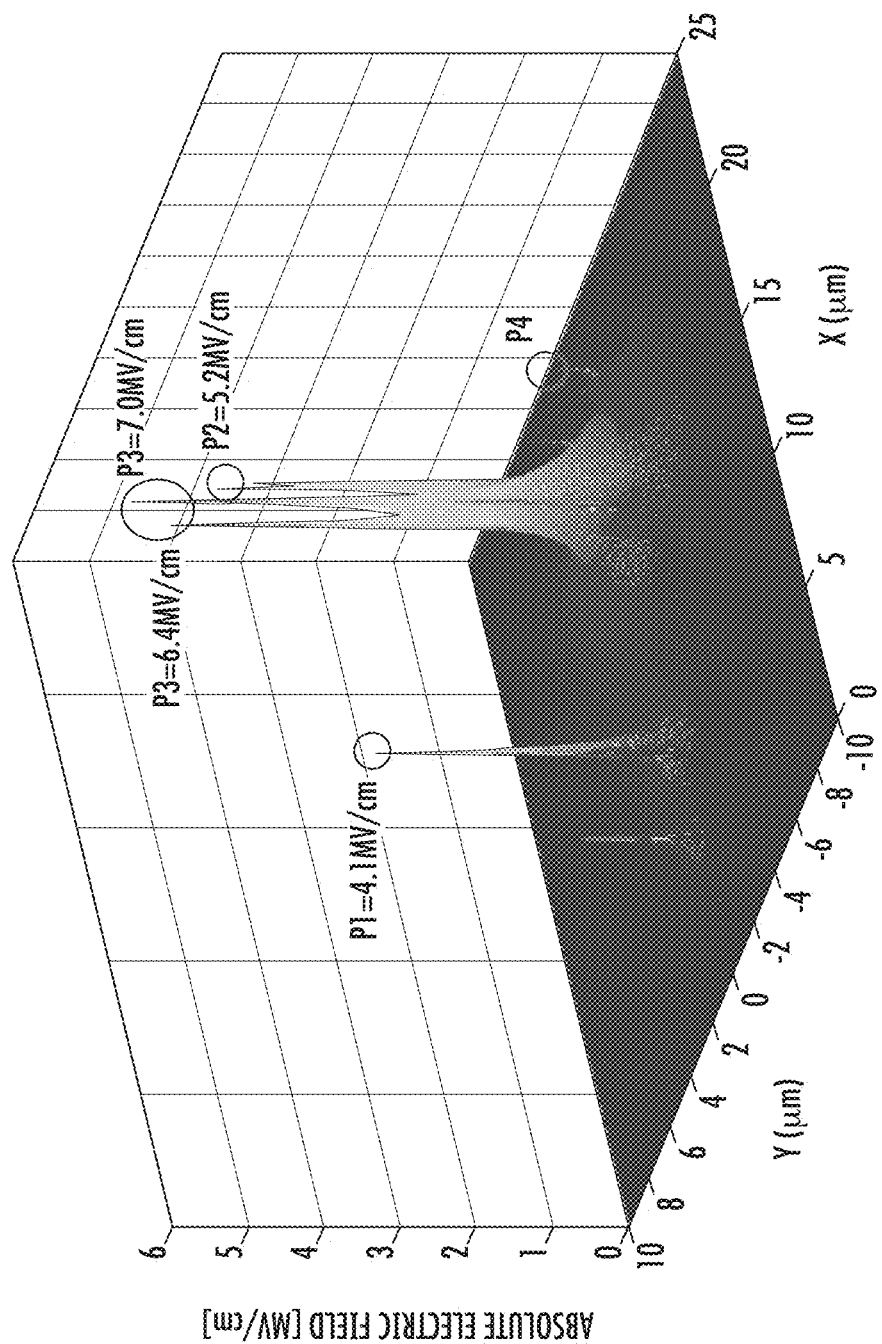
FIG. 5B shows a plot of absolute electric field within the structure of FIG. 5A.

Comparing the measured electric field peaks of a state of the art DPOA section as shown in FIG. 5A to the electric field peaks of a device according to the teachings of the invention as shown in FIG. 10A shows a reduction in electric field peaks. As shown in the plotted measurements of FIGS. 5B and 10B, the plotted measurements related to point P2 showed a reduction in electric field peak from 5.2 MV/cm to 3.2 MV/cm. The plotted measurements of point P3 showed a reduction in electric field peak from 6.4 MV/cm to 5.1 MV/cm.

Figure 11:
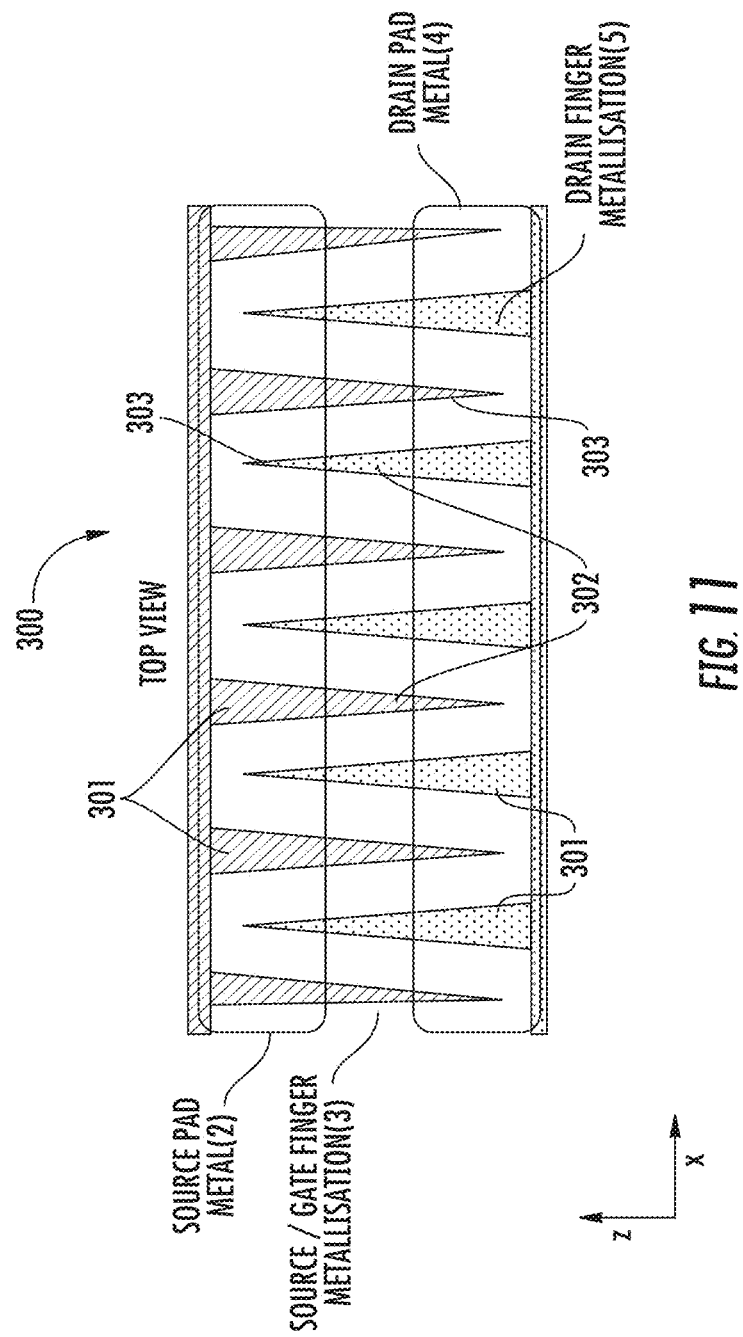
FIG. 11 shows a top view of an embodiment of a semiconductor device having source finger metallization and drain finger metallization with sloped sides and varying dimensions.

FIG. 11 shows schematically a top view of a BPOA layout according to another embodiment of a semiconductor device 300. FIG. 11 is similar to FIG. 7 except that in the embodiment of FIG. 11 a dimension, for example, the width of the finger metallizations of the field plates varies continuously, such that the sides of the finger metallizations are tapered, angled or sloped, from a greater dimension portion 301 under respective source metal of a source bonding pad or drain metal of a drain bonding pad, to an intermediate dimension portion 302 between the source metal and drain metal pads NPOA sections, to a lesser dimension portion 303 under opposite respective source metal or drain metal pads as the case may be. As shown, the field plates are tapered from section 301, continuing to taper through section 302, and continuing to taper through section 303, such that the width, and therefore a dimension, is different depending on whether a field plate is under a source bonding pad, a drain bonding pad, or no bonding pad.

Figure 12:
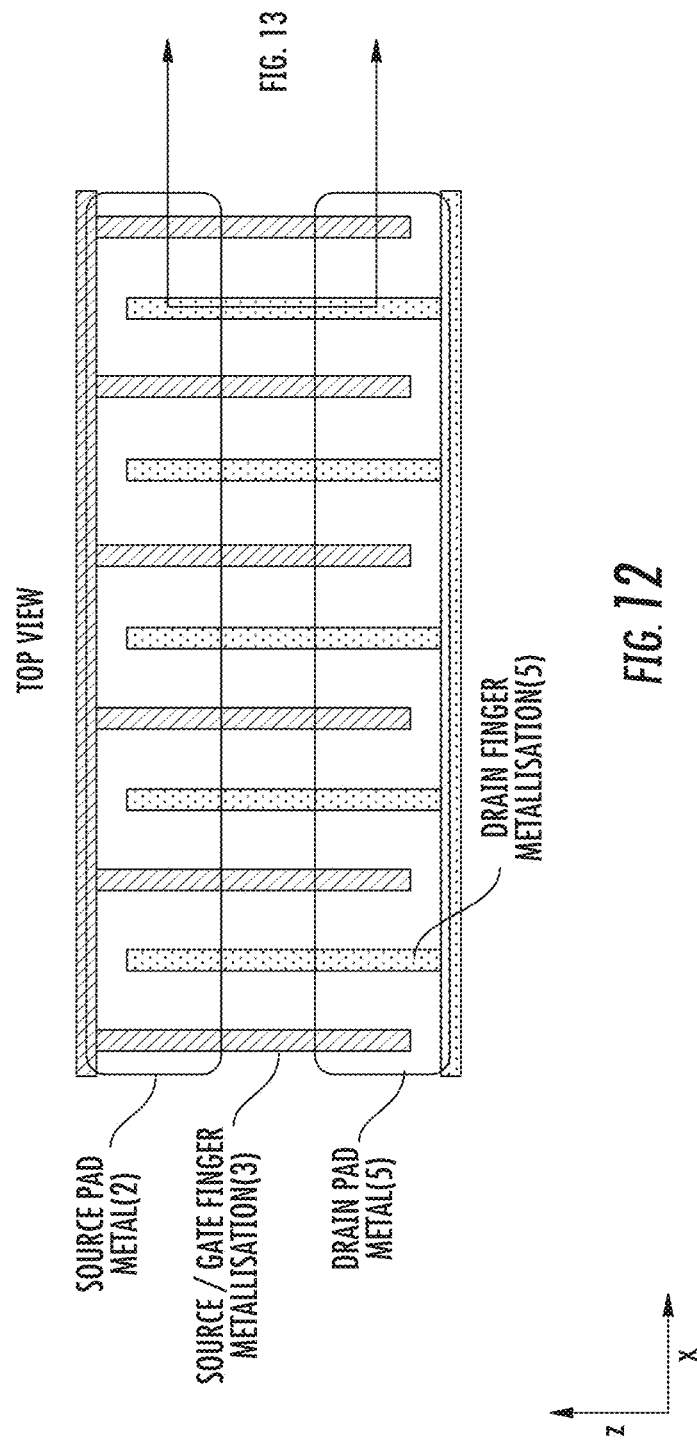
FIG. 12 shows a top view of an embodiment of a semiconductor device having a field plate at a bonding pad edge.
Figure 13:
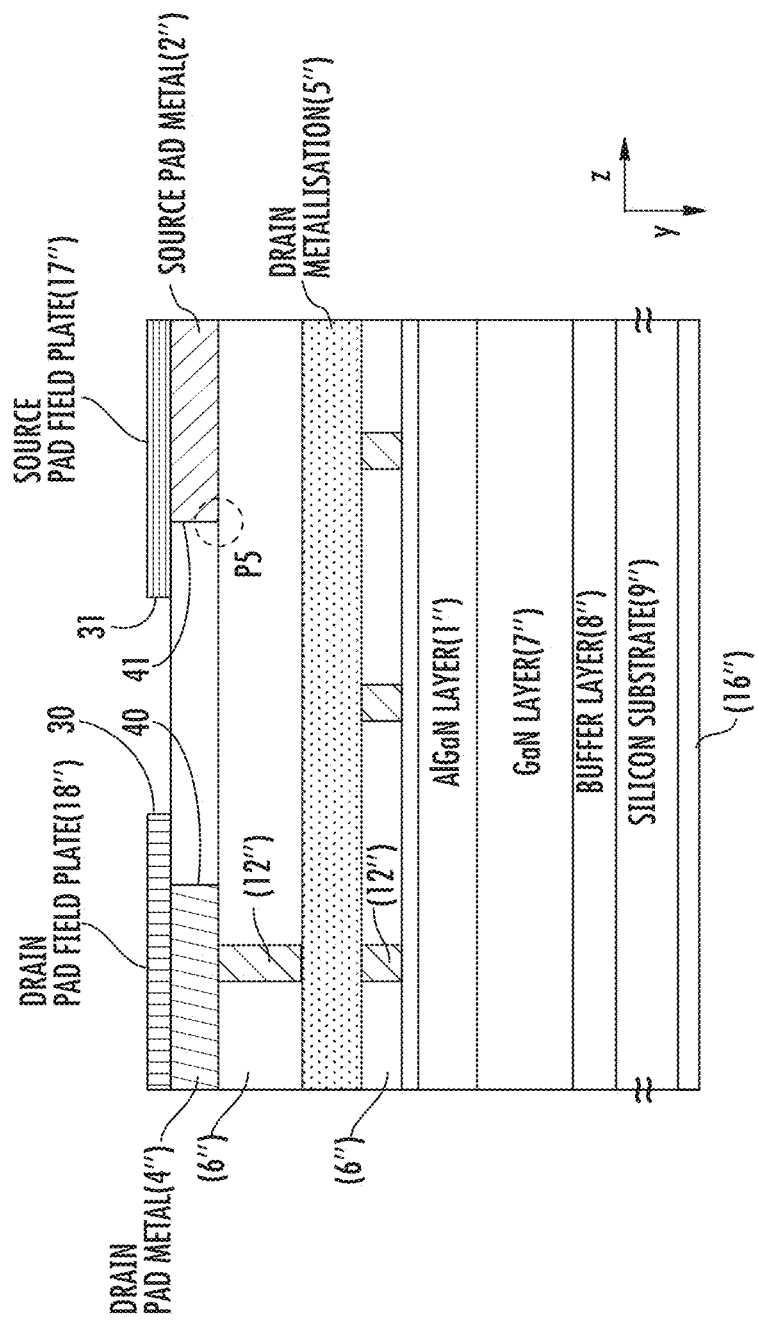
FIG. 13 shows a cross-section of the embodiment of FIG. 12.

FIGS. 12 and 13 show an embodiment of semiconductor device 400 with a field plate extending beyond an inner bonding pad edge, where field plates are situated above the bonding pads. As shown in FIG. 12, the dimensions of the finger metallizations in different areas of the device are not necessarily varied. FIG. 13 shows schematically a cross section taken along the designated area of the device shown in FIG. 12. According to this embodiment, a source field plate 17" and a drain field plate 18" are situated above bonding pads 2", 4". The inner portions 30, 31 of the source field plate 17" and drain field plate 18" also extend beyond the inner edge portions 40, 41 of the bonding pads 2", 4", as shown in FIG. 13. The extension and positioning of the source field plate 17" and drain field plate 18" as shown in FIGS. 12 and 13 reduce the electrical field peak at the drain pad edge, such as at P5 indicated in FIG. 13.

Figure 14A:
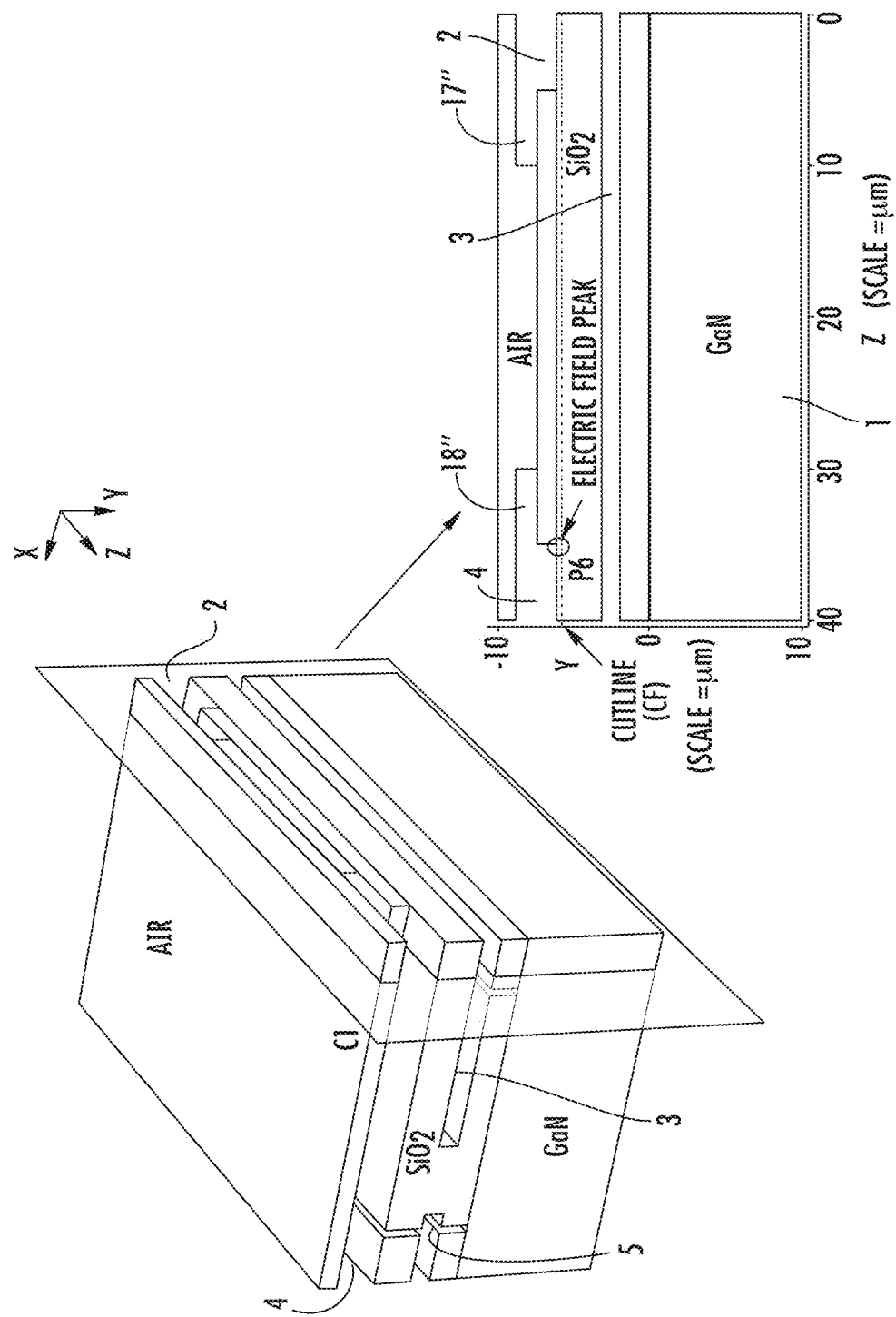
FIG. 14A shows perspective and cross-section views of computer modeling relating to the embodiment shown in FIG. 12.
Figure 14B:
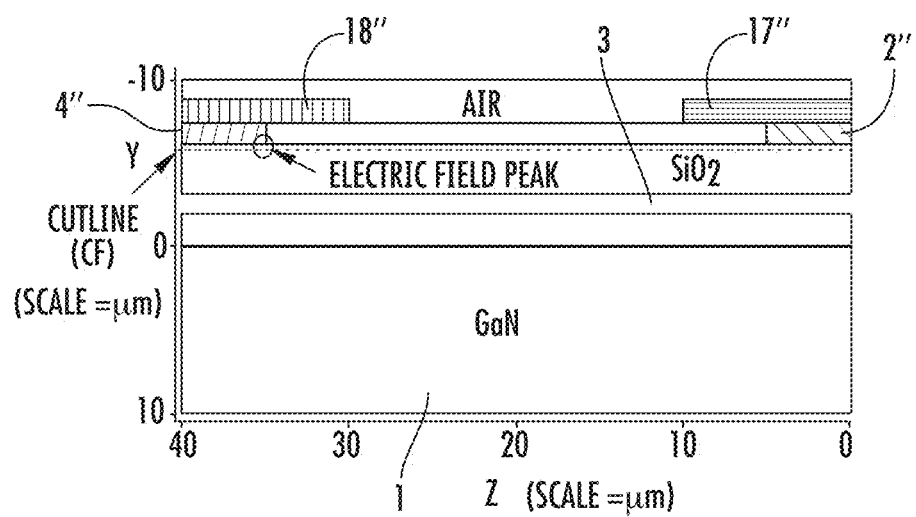
FIG. 14B shows an additional view of the computer modeling shown in FIG. 12.
Figure 14C:
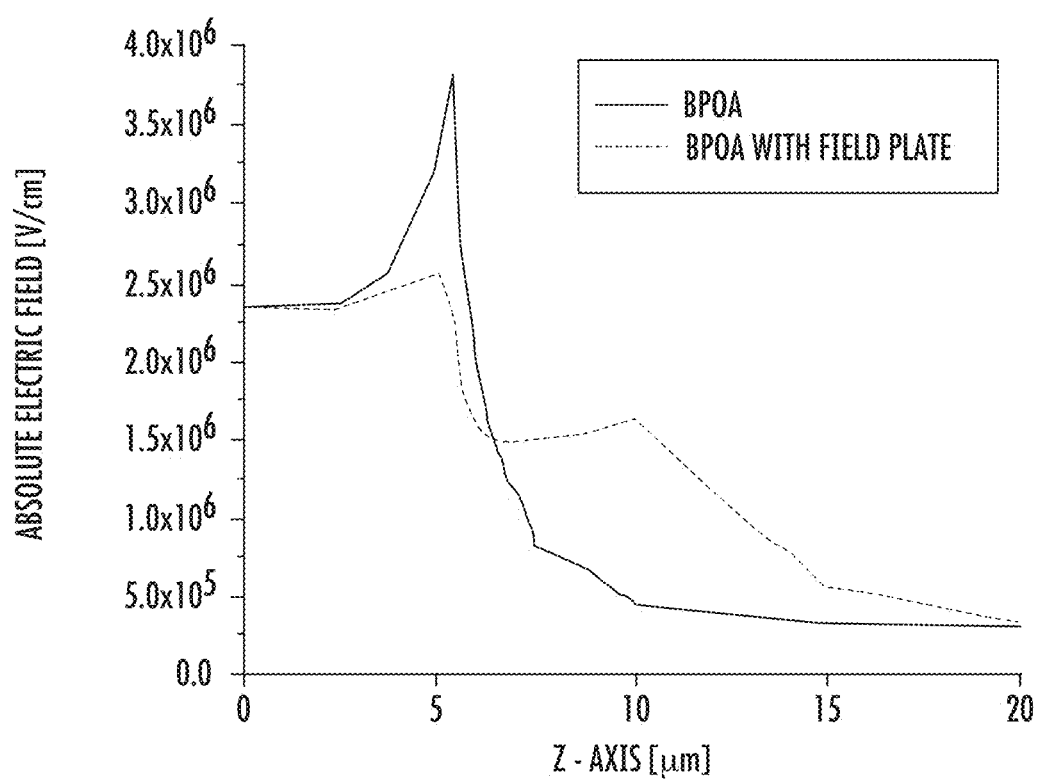
FIG. 14C shows a plot of absolute electric field within the structure of FIG. 12.

FIGS. 14A, 14B and 14C show computer modeling of the embodiments of FIGS. 12 and 13, illustrating a BPOA structure with a field plate positioned above the bonding pads, and extending inwardly beyond the bonding pads. The illustration shown in FIG. 14A shows the open areas where the source field plate 17" and drain field plate 18" are positioned, above the bonding pads 2", 4". This arrangement further reduces the electrical field peak at the drain pad edge, such as at position P6 indicated in FIG. 14A. FIG. 14B shows the source field plate 17" and drain field plate 18" and the bonding pads 2", 4" in position.

FIG. 14C shows how this field plate reduces the maximum electric field achieved at the pad edge when the field plate structure is used as shown in, for example, FIGS. 12 and 13. The plotted data compares a state of the art BPOA device with a BPOA device according to the invention as in FIGS. 12 and 13. A reduction of the electric field peak observed at the edge of both the drain pad and source pad through the use of a pad edge field plate was achieved, as shown for example in FIG. 14C. A maximum absolute electric field level of 4 MV/cm was observed in the illustrative device analyzed at a location analogous to P5 in FIG. 13. As shown in FIG. 14C, with the field plate optimized as proposed herein a reduction by 35% of the electric field peak was achieved at position P5 of FIG. 13.

Figure 15:
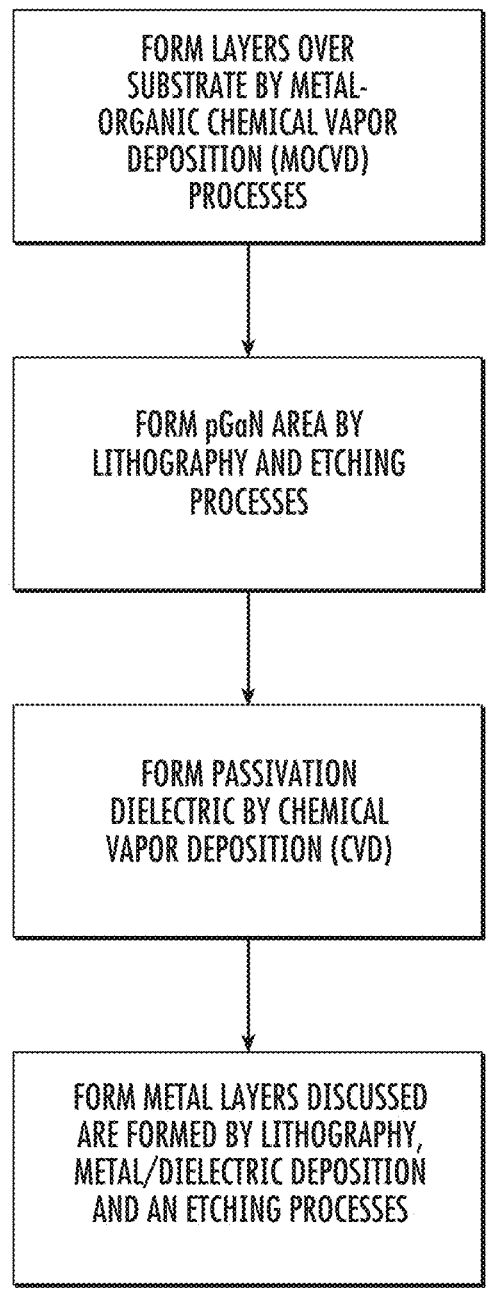
FIG. 15 is a flow chart of an illustrative fabrication process for forming a semiconductor device according to the invention.

A method of fabricating a power semiconductor is also provided, shown in the flow chart of FIG. 15. Generally, a BPOA semiconductor device as in the present invention is formed by a fabrication process of metal-organic chemical vapor deposition (MOCVD) processes for forming buffer layers 8, GaN layer 7, AlGaN layer 1 and pGaN layer 11 over substrate 9. The pGaN area is formed by lithography and etching processes. The passivation dielectric 15 is formed by chemical vapor deposition (CVD). The metal layers discussed are formed by lithography, metal/dielectric deposition and an etching sequence. It is appreciated that the foregoing formation processes can occur in any acceptable order during the fabrication process, and are not limited to a specific order.

Although the features and elements of the present invention are described in the example embodiments in particular combinations, each feature may be used alone without the other features and elements of the example embodiments or in various combinations with or without other features and elements of the present invention. Changes in the form and the proportion of components or parts as well as in the substitution of equivalents are contemplated as circumstances may suggest or render expedient without departing from the spirit or scope of the invention.

The foregoing descriptions have been presented for purposes of illustration and description. They are not intended to be exhaustive or to limit the invention to the precise forms disclosed, and many modifications and variations are possible in light of the above teachings. The invention is to be construed according to the claims and their equivalents.

What is claimed is:

1. A semiconductor device comprising:
   a source bonding pad;
   a drain bonding pad;
   a drain metallization structure comprising a drain field plate; and
   a source metallization structure comprising a source field plate;
   at least a portion of the source bonding pad being situated directly over an active area of the device in a first area of the device;
   at least a portion of the drain bonding pad being situated directly over an active area of the device in a second area of the device;
   wherein the source field plate has a first dimension positioned in the first area, and a second dimension different from the first dimension positioned in an area of the device other than the first area; and
   wherein the drain field plate has a first dimension positioned in the second area, and a second dimension different from the first dimension positioned in an area of the device other than the second area.

2. The semiconductor device of claim 1, wherein the second dimension of the source field plate is positioned in the second area, and wherein the second dimension of the drain field plate is positioned in the first area.

3. The semiconductor device of claim 2, wherein an area of the device has no bonding pad situated directly over an active area of the device in a third area of the device, wherein the source field plate has a third dimension different from either the first dimension or the second dimension of the source field plate positioned in the third area, and wherein the drain field plate has a third dimension different from either the first dimension or the second dimension of the drain field plate positioned in the third area.

4. The semiconductor device of claim 1, wherein a dimension of at least one of the drain field plate or the source field plate varies continuously.

5. The semiconductor device of claim 3, wherein the first dimension of the source field plate is larger than the second dimension of the source field plate or the third dimension of the source field plate, and wherein the first dimension of the drain field plate is larger than the second dimension of the drain field plate or the third dimension of the drain field plate.

6. A method of making a semiconductor device comprising:
   forming a source bonding pad;
   forming a drain bonding pad;
   forming a drain metallization structure comprising a drain field plate;
   forming a source metallization structure comprising a source field plate;
   situating at least a portion of the source bonding pad directly over an active area of the device in a first area of the device;
   situating at least a portion of the drain bonding pad directly over an active area of the device in a first area of the device; and
   positioning a portion of the source field plate having a first dimension in the first area, and positioning a portion of the source field plate having a second dimension different from the first dimension in an area of the device other than the first area; and
   positioning a portion of the drain field plate having a first dimension in the second area, and positioning a portion of the drain field plate having a second dimension different from the first dimension in an area of the device other than the second area.

7. The method of claim 6, further comprising positioning the second dimension of the source field plate in the second area, and positioning the second dimension of the drain field plate in the first area.

8. The method of claim 7, wherein an area of the device has no bonding pad situated directly over an active area of the device in a third area; wherein the source field plate has a third dimension different from either the first dimension or the second dimension of the source field plate, and further comprising positioning the third dimension of the source field plate in the third area; and wherein the drain field plate has a third dimension different from either the first dimension or the second dimension of the drain field plate, and further comprising positioning the third dimension of the drain field plate in the third area.

9. The method of claim 6, wherein a dimension of at least one of the drain field plate or the source field plate varies continuously.

10. The method of claim 8, further comprising forming the first dimension of the source field plate to be larger than the second dimension of the source field plate or the third dimension of the source field plate, and forming the first dimension of the drain field plate to be larger than the second dimension of the drain field plate or the third dimension of the drain field plate.

* * * * *